(12) United States Patent
Chen et al.

(10) Patent No.: US 10,861,957 B2
(45) Date of Patent: Dec. 8, 2020

(54) FINFET DEVICES AND METHODS OF FORMING

(71) Applicant: Taiwan Semiconductor Manufacturing Company, Ltd., Hsinchu (TW)

(72) Inventors: Chia-Cheng Chen, Hsinchu (TW); Huicheng Chang, Tainan (TW); Liang-Yin Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 14 days.

(21) Appl. No.: 16/230,333

(22) Filed: Dec. 21, 2018

(65) Prior Publication Data

US 2019/0123181 A1    Apr. 25, 2019

Related U.S. Application Data

(62) Division of application No. 15/641,042, filed on Jul. 3, 2017, now Pat. No. 10,164,066.
(Continued)

(51) Int. Cl.
*H01L 29/66* (2006.01)
*H01L 29/78* (2006.01)
(Continued)

(52) U.S. Cl.
CPC .... *H01L 29/66795* (2013.01); *H01L 21/0214* (2013.01); *H01L 21/0217* (2013.01); *H01L 21/0228* (2013.01); *H01L 21/0262* (2013.01); *H01L 21/02178* (2013.01); *H01L 21/02247* (2013.01); *H01L 21/02532* (2013.01); *H01L 29/1033* (2013.01); *H01L 29/66545* (2013.01); *H01L 29/7851* (2013.01); *H01L 21/02255* (2013.01)

(58) Field of Classification Search
CPC ... H01L 29/66; H01L 29/66795; H01L 21/02; H01L 29/1033; H01L 29/66545; H01L 29/78; H01L 29/7851; H01L 21/0214; H01L 21/0217; H01L 21/02178; H01L 21/02247; H01L 21/0228; H01L 21/02532; H01L 21/0262
USPC ........................................................ 257/288
See application file for complete search history.

(56) References Cited

U.S. PATENT DOCUMENTS 8,796,666 B1    8/2014  Huang et al.
8,815,712 B2    8/2014  Wan et al.
(Continued)

OTHER PUBLICATIONS

Dingemans, G., et al., "Plasma-Assisted Atomic Layer Deposition of Low Temperature SiO2," The Electrochemical Society, ECS Transactions, 35 (4) 191-204 (2011, pp. 191-204.
(Continued)

*Primary Examiner* — Fazli Erdem
(74) *Attorney, Agent, or Firm* — Slater Matsil, LLP

(57) ABSTRACT

A finFET device and methods of forming a finFET device are provided. The method includes forming a capping layer over a fin of a fin field effect transistor (finFET), where the fin is formed of a material comprising germanium. The method also includes forming a dummy dielectric layer over the capping layer. The method also includes forming a dummy gate over the dummy dielectric layer. The method also includes removing the dummy gate.

20 Claims, 51 Drawing Sheets

Related U.S. Application Data

(60) Provisional application No. 62/427,332, filed on Nov. 29, 2016.

(51) Int. Cl.
  *H01L 21/02* (2006.01)
  *H01L 29/10* (2006.01)

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,312,183 B1 | 4/2016 | Kim et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0341638 A1 | 12/2013 | Liao et al. |
| 2015/0079752 A1 | 3/2015 | Wu et al. |
| 2015/0171177 A1 | 6/2015 | Cheng et al. |
| 2015/0200252 A1* | 7/2015 | Ching ............... H01L 29/0649 257/510 |
| 2015/0340461 A1 | 11/2015 | Wei et al. |
| 2016/0211338 A1 | 7/2016 | Wang et al. |
| 2016/0379831 A1 | 12/2016 | Yeo et al. |
| 2016/0380056 A1 | 12/2016 | Yeo et al. |
| 2017/0025313 A1* | 1/2017 | Ching ............... H01L 27/1207 |
| 2017/0053912 A1 | 2/2017 | Ching et al. |

OTHER PUBLICATIONS

Groner, M.D., et al., "Low-Temperature Al2O3 Atomic Layer Deposition," Chem. Mater. 2004, 16, pp. 639-645.

\* cited by examiner

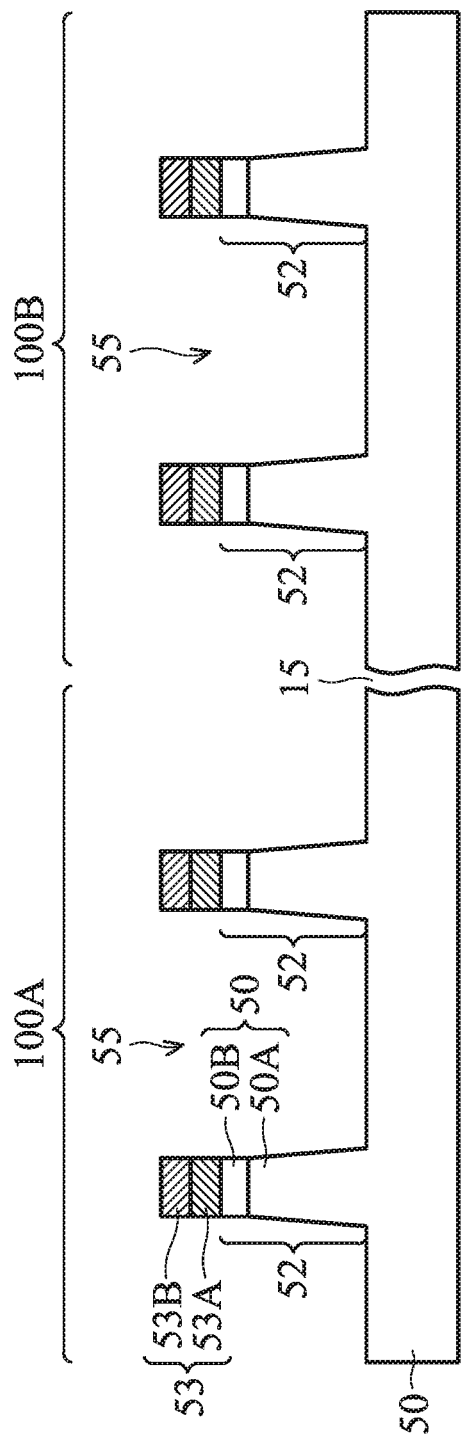
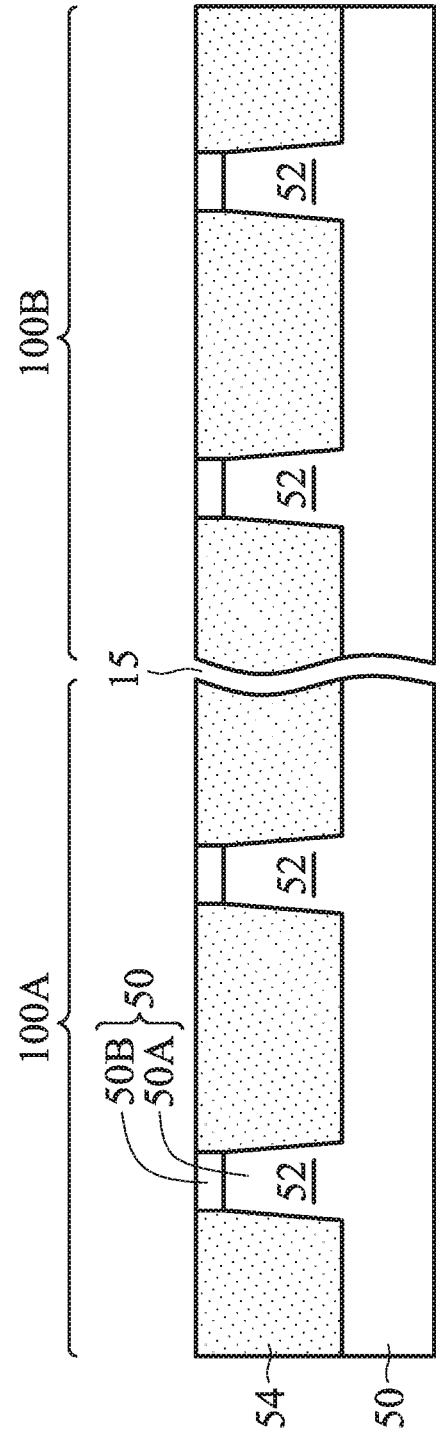

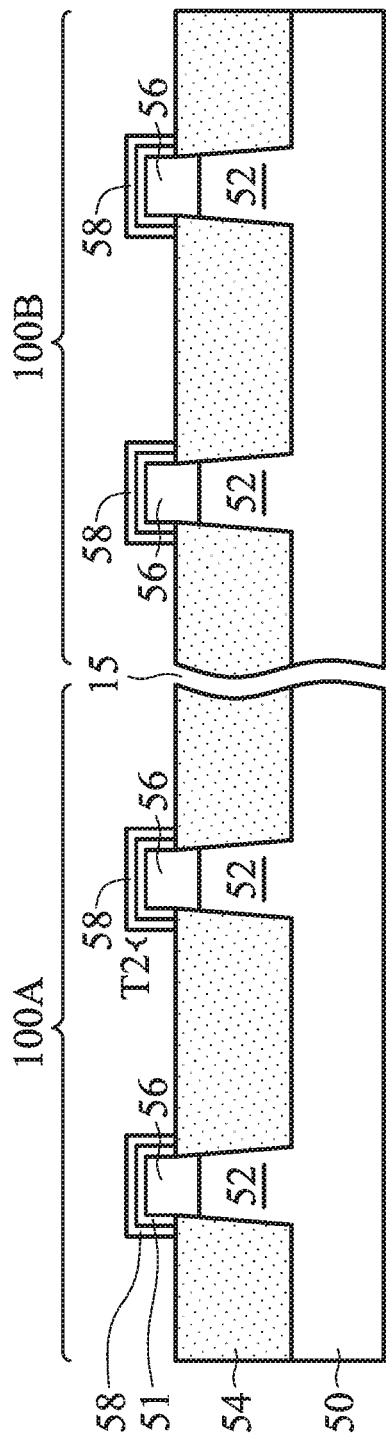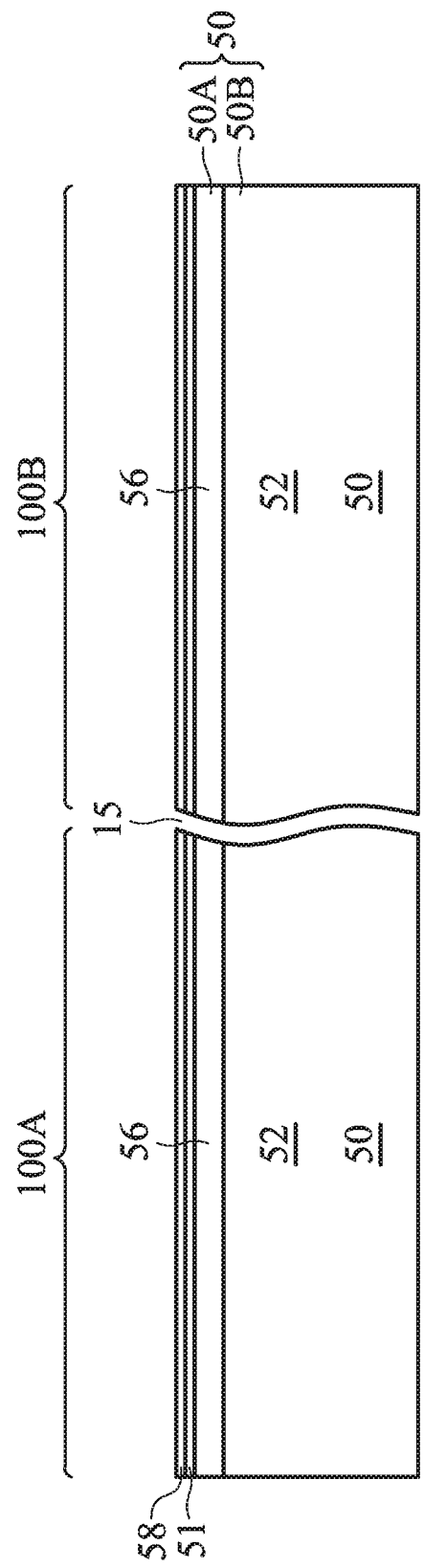

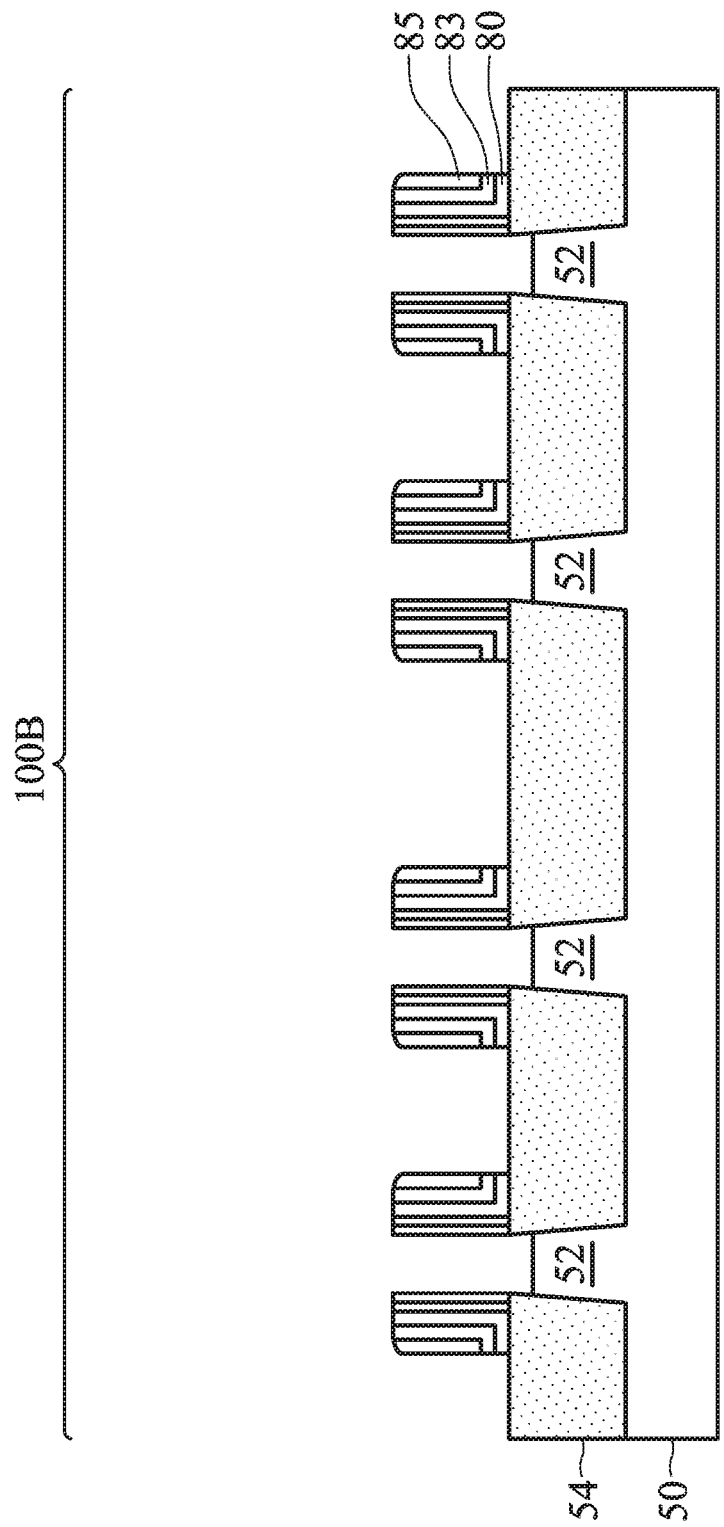

FINFET DEVICES AND METHODS OF FORMING

PRIORITY CLAIM AND CROSS-REFERENCE

This application is a divisional of U.S. application Ser. No. 15/641,042, filed Jul. 3, 2017, entitled "FinFET Devices and Methods of Forming," now U.S. Pat. No. 10,164,066, issued Dec. 25, 2018, which claims priority to U.S. Provisional Application No. 62/427,332, filed on Nov. 29, 2016, both of which are hereby incorporated by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-5 are cross-sectional views of intermediate stages in the manufacture of a finFET device in accordance with some embodiments.

FIGS. 7A and 7B are cross-sectional views of intermediate stages in the manufacture of a finFET device in accordance with some embodiments.

FIGS. 18A, 18B and 18C are cross-sectional views of an intermediate stage in the manufacture of a finFET device in accordance with some embodiments.

DETAILED DESCRIPTION

Figure 1:
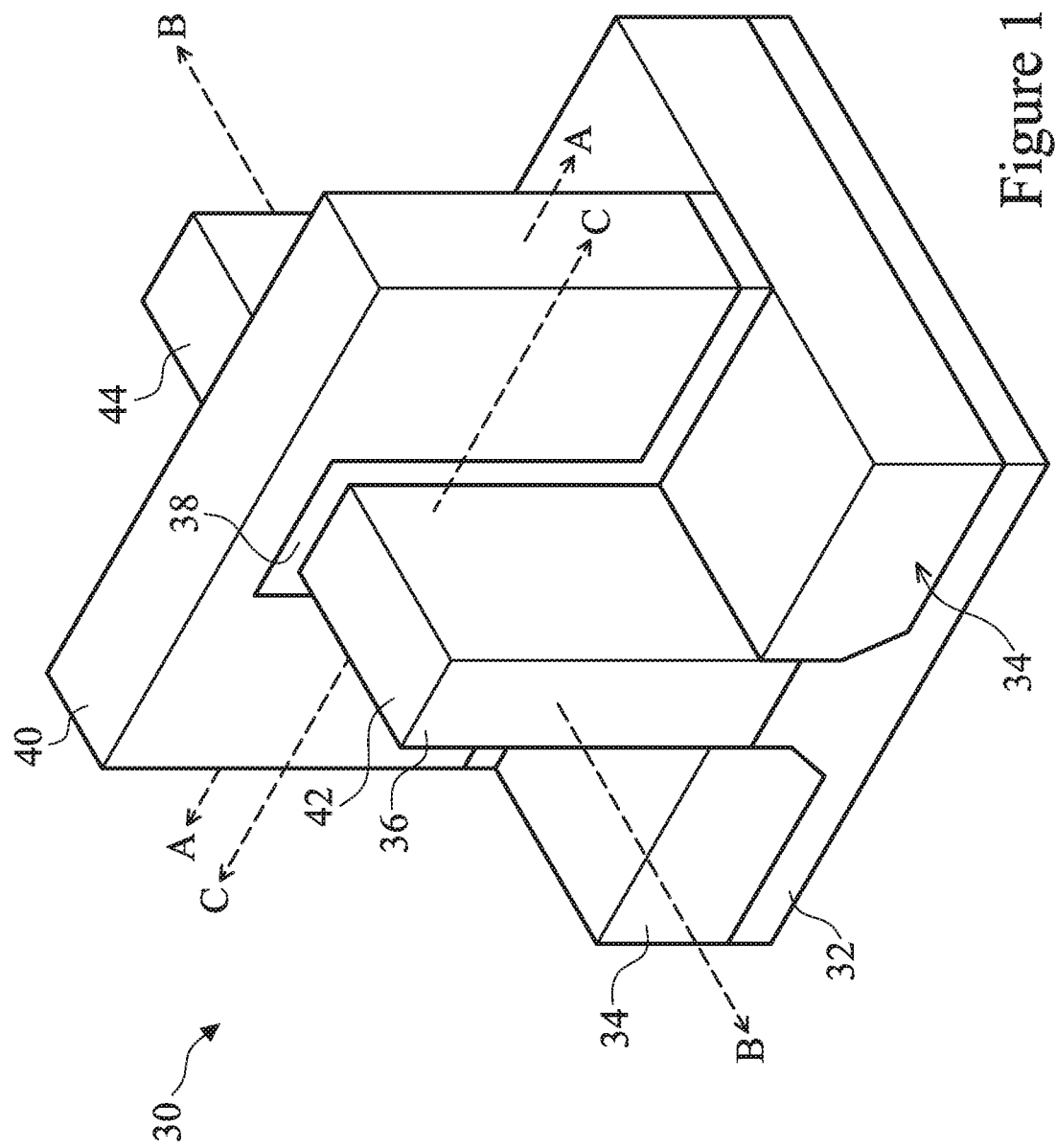
FIG. 1 is a perspective view of a fin field effect transistor ("finFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a fin field-effect transistor (FinFET) 30 in a three-dimensional view. The finFET 30 comprises a fin 36 on a substrate 32. The finFET 30 also includes isolation regions 34 formed over the substrate 32, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is across a channel, gate dielectric 38, and gate electrode 40 of the FinFET 30. Cross-section C-C is in a plane that is parallel to cross section A-A and is across fin 36 outside of the channel region. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 27 are cross-sectional views of intermediate stages in the manufacturing of FinFETs in accordance with an exemplary embodiment. FIGS. 2 through 5, and 26 and 27, illustrate reference cross-section A-A illustrated in FIG. 1, except for multiple FinFETs. In FIGS. 6A-B through 25A-B, figures ending with an "A" designation are illustrated along a similar cross-section A-A; figures ending with a "B" designation are illustrated along a similar cross-section B-B; and figures ending with a "C" designation are illustrated along a similar cross-section C-C. FIGS. 17 and 20 are depicted along cross section C-C.

Figure 2:
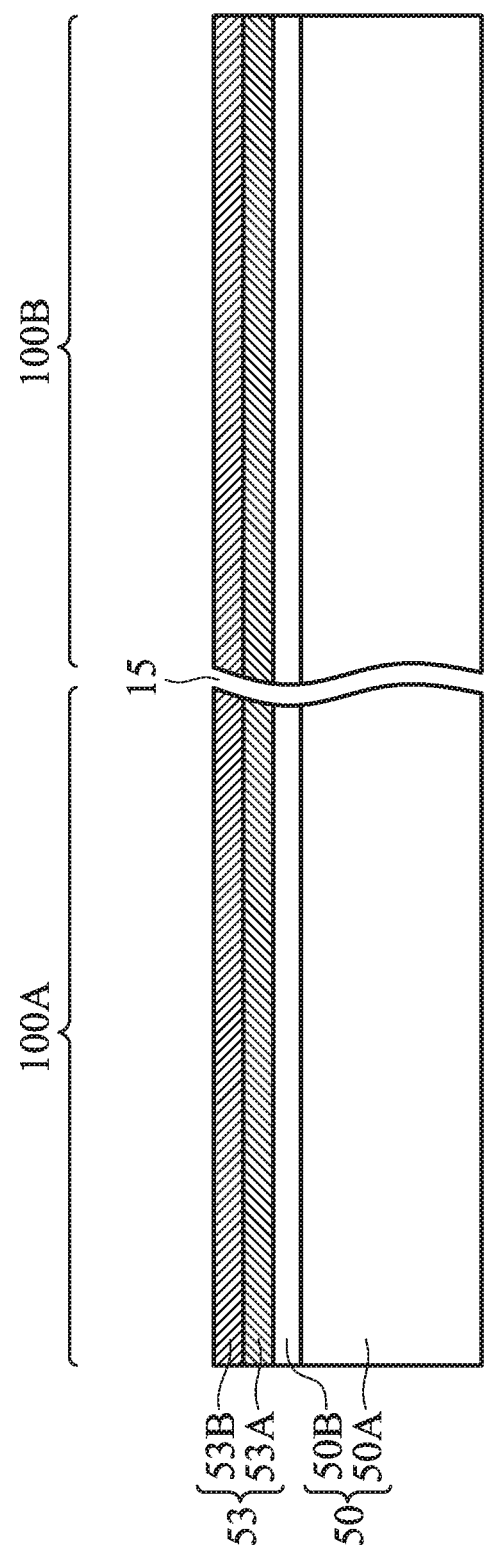

FIG. 2 illustrates a substrate 50 comprising bottom substrate 50A and epitaxy region 50B. Bottom substrate 50A may be a semiconductor substrate, such as a bulk semiconductor, a semiconductor-on-insulator (SOI) substrate, or the like, which may be doped (e.g., with a p-type or an n-type dopant) or undoped. The bottom substrate 50A may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Epitaxy region 50B may be formed over bottom substrate 50A in some embodiments. For example, epitaxy region 50B may be epitaxially grown on a top surface of bottom substrate 50A. In some embodiments, epitaxy region 50B may comprise germanium. For example, epitaxy region 50B may comprise $Si_xGe_{1-x}$, where x can be between approximately 0 and 1. Epitaxy region 50B may be formed of a material that is different that a material that is used to form the bottom substrate 50A in some embodiments. For example, bottom substrate 50A may be free or substantially free of germanium in some embodiments.

The substrate 50 has a first region 100A and a second region 100B. The first region 100A can be for forming n-type devices, such as NMOS transistors, such as n-type FinFETs. The second region 100B can be for forming p-type devices, such as PMOS transistors, such as p-type FinFETs. The divider 15 between the first region 100A and the second region 100B indicates a physical separation between the first region 100A and the second region 100B. Components of first region 100A may be physically separated from components of second region 100B, but are illustrated side by side in FIGS. 2 through 24B for purposes of illustration.

Although epitaxy region 50B is depicted as being formed in both region 100A and region 100B, in some embodiments epitaxy region may only be formed on region 100A or region 100B.

FIG. 2 also shows the forming of mask 53 over substrate 50. In some embodiments, mask 53 may be used in a subsequent etching step to pattern substrate 50 (See FIG. 3). As shown in FIG. 2, mask 53 may include first mask layer 53A and second mask layer 53B. Mask layer 53A may be a hard mask layer, such as silicon nitride or the like, and may be formed using any suitable process, such as a deposition, atomic layer deposition (ALD) or physical vapor deposition (PVD). Mask layer 53A may be used to prevent or minimize an etching of substrate 50 underlying mask layer 53A in the subsequent etch step (See FIG. 3). Mask layer 53B may comprise photoresist, and in some embodiments may be used to pattern mask layer 53A for use in the subsequent etching step discussed above. Mask layer 53B can be formed by using a spin-on technique and can be patterned using acceptable photolithography techniques. In some embodiments, three or more masks 53 may be used.

FIG. 3 illustrates the formation of semiconductor strips 52 in the substrate 50. First, mask layers 53A and 53B may be patterned, where openings in mask layers 53A and 53B expose areas of substrate 50 where trenches 55 will be formed. In some embodiments, the masks 53A and 53B may be patterned using a multiple-patterning process, such as a self-aligned double patterning (SADP) process, a self-aligned quadruple patterning (SAQP) process, or the like, that allows for forming features having a reduced critical dimension (CD) and pitch. In such embodiments, one or more additional mask layers, one or more mandrel layers, and one or more spacer layers (not shown) may be formed over the mask 53. The one or more additional mask layers, the one or more mandrel layers, and the one or more spacer layers may be patterned to form desired patterns, which are transferred to the mask 53.

Next, an etching process may be performed, where the etching process creates trenches 55 in substrate 50 through openings in mask 53. Trenches 55 may extend through epitaxy region 50B and partially through bottom substrate 50A in some embodiments. The remaining sections of substrate 50 underlying patterned mask 53 form a plurality of semiconductor strips 52. The etching may be any acceptable etch process, such as a reactive ion etch (RIE), neutral beam etch (NBE), the like, or a combination thereof. The etch may be anisotropic.

In FIG. 4 an insulation material is formed between neighboring semiconductor strips 52 to form isolation regions 54. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used.

Furthermore, in some embodiments, isolation regions 54 may include a conformal liner (not illustrated) formed on sidewalls and a bottom surface of trenches 55 (see FIG. 3) prior to the filling of trenches 55 with an insulation material of isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like. The formation of the liner may include any suitable method, such as, ALD, CVD, high density plasma (HDP) CVD, PVD, and the like. In such embodiments, the liner may prevent (or at least reduce) the diffusion of semiconductor material from semiconductor strips 52 (e.g., Si and/or Ge) into the surrounding isolation regions 54 during the annealing of isolation regions 54.

An anneal process may be performed once the insulation material is formed. In the illustrated embodiment, the insulation material is silicon oxide formed by a FCVD process. The insulating material may be referred to as isolation regions 54. Further in FIG. 4, a planarization process, such as a chemical mechanical polish (CMP), may remove any excess insulation material and form top surfaces of the isolation regions 54 and top surfaces of the semiconductor strips 52 that are coplanar. In some embodiments, the CMP may also remove mask 53. In other embodiments mask 53 may be removed using a wet cleaning process.

Figure 5:
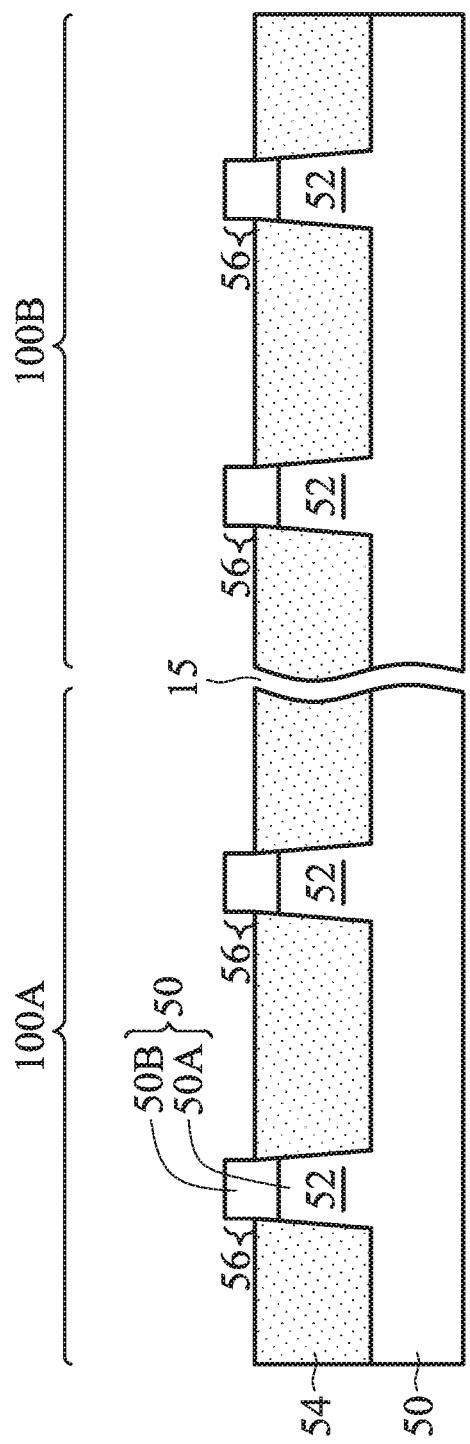

FIG. 5 illustrates the recessing of the isolation regions 54 to form Shallow Trench Isolation (STI) regions 54. The isolation regions 54 are recessed such that fins 56 in the first region 100A and in the second region 100B protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 4 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

As will be described in detail below, in subsequent processing a dummy dielectric and a dummy gate may be formed over fins 56 (see FIGS. 7A-B and 10A-C). In some embodiments, fins 56 may comprise certain ions that diffuse from fin 56 into the dummy gate dielectric and dummy gate. For example, if fins 56 comprise germanium, then the germanium in the fins 56 may diffuse from fins 56 into the dummy gate dielectric and the dummy gate. In some embodiments, germanium may diffuse until there is a high concentration of germanium at an interface of the dummy dielectric and the dummy gate. The high concentration of germanium at the interface of the dummy dielectric and the dummy gate may cause a degradation in the material of the dummy gate dielectric along the interface. During a subsequent removal of the dummy gate and the dummy dielectric to form a replacement gate and replacement gate dielectric, the degradation in the quality of the material of the dummy gate dielectric may create undesirable residue in the opening created by the removal of the dummy gate and the dummy dielectric. The residue may prevent the replacement gate and/or replacement gate dielectric from being successfully deposited, which may reduce performance of the device and/or may prevent the device from operating normally. The residue may decrease manufacturing yield rates.

Figure 6A:
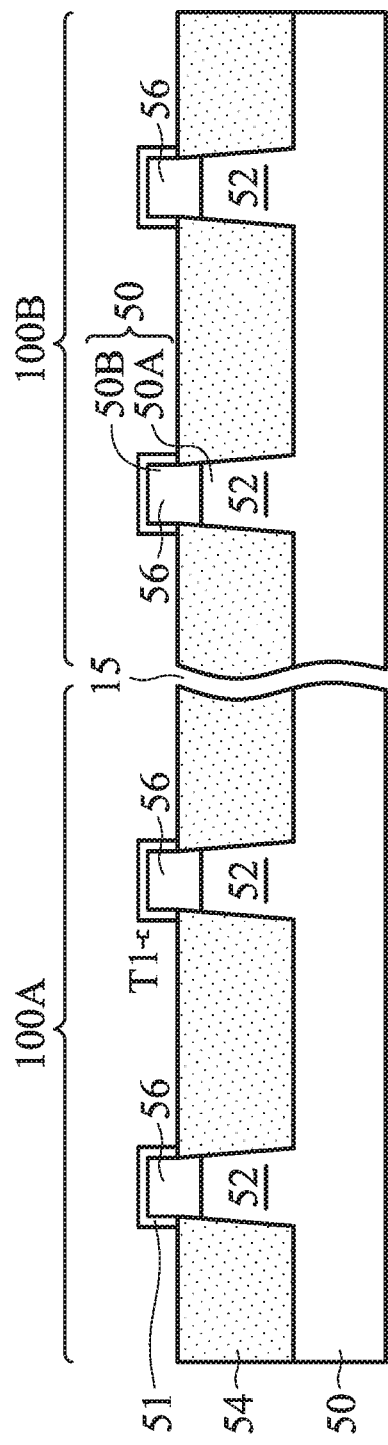
FIGS. 6A and 6B are cross-sectional views of intermediate stages in the manufacture of a finFET device in accordance with some embodiments.
Figure 6B:
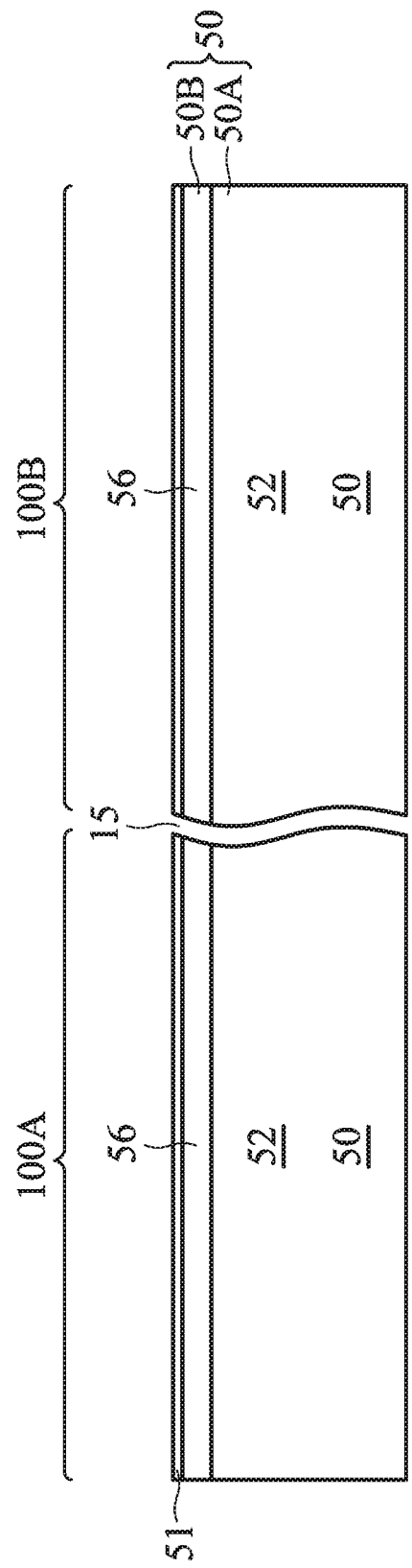

Referring to FIGS. 6A and 6B, a capping layer 51 may be formed over fins 56. Capping layer 51 may help to reduce or prevent a diffusion of ions, e.g. germanium, from fins 56 into subsequently formed dummy dielectric layer 58 (see FIGS. 7A and 7B) and subsequently formed dummy gates 70 and 76 (see FIGS. 10A-C). Capping layer 51 may prevent or reduce the formation of the residue created during the removal of dummy gates 70 and 76 and dummy dielectric 58 that is caused by the build up of germanium at the interface between the dummy dielectric 58 and the dummy gates 70 and 76.

Capping layer 51 may be formed of any suitable material and using any method that is suitable for forming a capping layer over fins 65. For example, capping layer 51 may be formed using atomic layer deposition (ALD) or the like. In some embodiments, capping layer 51 may be formed of substantially pure silicon, and may be formed by epitaxially growing a layer of silicon over fins 56 or by a deposition process. In other embodiments, capping layer 51 may be formed of SiON using a thermal nitridation and oxide deposition process. In other embodiments, capping layer 51 may be formed of $Al_2O_3$ using an ALD process. In other embodiments, capping layer 51 may be formed of $Si_3N_4$ using an ALD process. Each of these embodiments is described in detail below.

In some embodiments, capping layer 51 may be formed of substantially pure silicon. Capping layer 51 may be formed of substantially pure silicon using any suitable methods. In some embodiments, capping layer 51 may be formed by epitaxially growing a layer of silicon over fins 56 or by a deposition process, such as physical vapor deposition (PVD), plasma enhanced atomic layer deposition (ALD), or the like. In embodiments in which capping layer 51 comprises substantially pure silicon, capping layer 51 may be formed using a process that is performed at a temperature of about 500° C. or less. When capping layer 15 is formed of substantially pure silicon, capping layer 51 may have a thickness T1 in a range of about 10 Å to about 20 Å. A thickness T1 of about 10 Å or more may sufficiently prevent or reduce the diffusion of germanium from fins 56 into a subsequently formed dummy dielectric and/or dummy gate. A thickness T1 of about 20 Å or less may prevent or reduce a degradation of channel performance. For example, when capping layer 51 is formed over a high mobility channel, a thickness T1 above 20 Å may reduce mobility of the channel such that the channel is no longer a high mobility channel. Controlling thickness T1 to be about 20 Å or less may prevent the channel mobility from being unduly degraded. Forming a capping layer 51 of substantially pure silicon as described herein may be suitable for fins 56 that have a concentration of germanium of about 25% or more.

In other embodiments, capping layer 51 may be formed using a thermal nitridation and oxide deposition process. In some embodiments, the thermal nitridation process is performed before the oxide deposition process. The thermal nitridation process may be performed at a temperature of about 600° C. to about 1000° C. and at pressures of about 1 Torr to about 500 Torr. The oxide deposition may be performed using ALD, chemical vapor deposition (CVD), plasma-enhanced ALD, or the like. In some embodiments, $SiO_2$ may be deposited using plasma-enhanced ALD. For example, Bis(diethylamino)silane (BDEAS) may be used as a precursor gas, followed by the plasma-enhanced ALD process using $C_8H_{22}N_2Si$ and $O_2$ plasma to deposit $SiO_2$. A first reaction state may be $SiH_2[N(C_2H_5)_2]_2$+—OH→—O—$SiH_2[N(C_2H_5)_2]$+$NH(C_2H_5)_2$. A second reaction state may be —O—$SiH_2[N(C_2H_5)_2]$+O*→—O—(Si—OH*)—O+$H_2O$+$CO_x$+other (N-containing species). The —O—(Si—OH*)—O of the second reaction state may create $SiO_2$. The plasma-enhanced ALD process may be performed at temperatures at about 400° C. or less. The thermal nitridation and oxide deposition processes may create a layer of SiON having a thickness T1 of about 5 Å to about 15 Å, and a surface of the SiON may have a surface N atomic percentage of about 2% to about 30%. Forming a capping layer 51 using a thermal nitridation and oxide deposition process as described herein may be suitable for fins 56 that have a concentration of germanium of about 25% or more.

In other embodiments, capping layer 51 may be formed of $Al_2O_3$. Capping layer 51 may be formed of $Al_2O_3$ using any suitable method. In some embodiments, $Al_2O_3$ may be formed using an ALD process. For example, Trimethylaluminum (TMA) may be used as a precursor, followed by an ALD process using $Al(CH_3)_3$ with $H_2O$ to deposit $Al_2O_3$. $Al_2O_3$ may be formed according to reaction A or B, where reaction A is AL-OH*+AL($CH_3$)→AL-O-AL($CH_3$)$_2$*+$CH_4$, and where reaction B is AL-$CH_3$*+$H_2O$→Al—OH*+$CH_4$. The AL-O-AL($CH_3$)$_2$* may form $Al_2O_3$, and impurities may be removed, for example during heating performed during subsequent processing. The ALD process may be performed at a temperature of about 300° C. In some embodiments, the ALD process may be performed at a temperature of less than about 300° C. A thickness of capping layer 51 may be determined at least in part in consideration of an operating voltage of the finFET device. For example, finFET devices having higher operating voltages, such as input/output finFET devices for example, may require a thicker gate dielectric, which in turn may require a thicker capping layer 51 at higher operating voltages than for lower operating voltages. For example, finFET devices may be configured to have voltages of about 1.5V to about 2.0V applied to the gate electrodes to turn on the finFET devices. When formed of $Al_2O_3$, and when fabricated for circuits in which about 1.8V is applied to the gate electrode to turn on the finFET device, capping layer 51 may have a thickness T1 of about 3 Å to about 47 Å. When formed of $Al_2O_3$, and when fabricated for circuits in which about 1.5V is applied to the gate electrode to turn on the finFET device, capping layer 51 may have a thickness T1 of about 3 Å to about 42 Å. When formed of $Al_2O_3$, a thickness T1 of 3A or more may enable the capping layer to prevent of reduce diffusion of germanium from fins 56 into subsequently formed dummy dielectric layer 58 (see FIGS. 7A and 7B) and subsequently formed dummy gates 70 and 76 (see FIGS. 10A-C). When formed of $Al_2O_3$, a thickness T1 of 3A or more may prevent or reduce the formation of residue created during the removal of dummy gates 70 and 76 and dummy dielectric 58 from a build up of germanium at the interface between the dummy dielectric 58 and dummy gates 70 and 76.

In other embodiments, capping layer 51 may be formed of $Si_3N_4$. Any suitable method of forming capping layer 51 of $Si_3N_4$ may be used. For example, capping layer may be formed by depositing $Si_3N_4$ using an ALD process. In some embodiments, dichlorosilane (DCS) may be used as a precursor, followed by an ALD process using $SiH_2Cl_2$ and $NH_3$ to deposit $Si_3N_4$. A reaction may include $3SiH_2Cl_2$+$4NH_3$→$Si_3N_4$+$6HCl$+$6H_2$. The ALD process may be performed at a temperature of about 500° C. In some embodiments, the ALD process may be performed at a temperature of less than about 500° C. FinFET devices may be configured to have voltages of about 1.5V to about 2.0V applied to the gate electrodes to turn on the finFET devices in accordance with some embodiments. For finFET devices that are formed to have 1.8V applied to the gate electrode to turn on the finFET device, the capping layer comprising $Si_3N_4$ may have a thickness T1 of about 20 Å to about 50 Å. For finFET devices that are formed to have 1.5V applied to the gate electrode to turn on the finFET device, the capping layer comprising $Si_3N_4$ may have a thickness T1 of about 20 Å to about 45 Å. When formed of $Si_3N_4$, a thickness T1 of 20A or more may enable the capping layer to prevent or reduce diffusion of germanium from fins 56 into subsequently formed dummy dielectric layer 58 (see FIGS. 7A and 7B) and subsequently formed dummy gates 70 and 76 (see FIGS. 10A-C). Capping layer 51 may prevent or reduce the formation of residue created during the removal of dummy gates 70 and 76 and dummy dielectric 58 from a build up of germanium at the interface between the dummy dielectric 58 and dummy gates 70 and 76.

In FIGS. 7A and 7B, a dummy dielectric layer 58 is optionally formed on the capping layer 51. The dummy dielectric layer 58 may be, for example, silicon oxide, silicon nitride, a combination thereof, or the like, and may be deposited (using, for example, CVD, PVD, or the like) or thermally grown (for example, using thermal oxidation or the like) according to acceptable techniques. According to some embodiments, the dummy dielectric layer 58 may comprise different materials than the capping layer 51. FIGS. 7A and 7B depict an embodiment in which the dummy dielectric layer 58 does not extend over isolation regions 54. In some embodiments, dummy dielectric layer 48 may extend over isolation regions 54.

As shown in FIGS. 7A and 7B, in some embodiments a dummy dielectric layer 58 is formed on the capping layer 51. Dummy dielectric layer may sometimes be referred to as an interfacial layer. In other embodiments a dummy dielectric layer 58 is not formed on the capping layer 51. The need for a dummy dielectric layer 58 may depend at least in part on the material composition of the capping layer 51 and an etch selectivity of the capping layer 51 with a material of a subsequently formed dummy gate 70 and 76. For example, during subsequent processing a dummy gate 70 and 76 will be formed (See FIGS. 10A-C) and subsequently removed (See FIGS. 23A-B). During the removal of the dummy gates 70 and 76, an etch stop layer is needed to determine a stopping point of the etching process. If capping layer 51 has a good etch selectivity compared to a material of the dummy gates 70 and 76, then a separate dummy dielectric may not be required. If the capping layer 51 does not have a good etch selectivity compared to a material of the dummy gates 70 and 76, then dummy dielectric 58 may be included and may act as the etch stop layer for the etch process.

In some embodiments, a thickness T2 of a combined thickness of the capping layer 51 and the dummy dielectric layer 58, if present, may be considered. In embodiments in which capping layer 51 is formed of substantially pure silicon, for finFET devices that are formed to have 1.5V applied to the gate electrode to turn on the finFET device, thickness T2 may be from about 25 Å to about 45 Å. For finFET devices that are formed to have 1.8V applied to the gate electrode to turn on the finFET device, thickness T2 may be from about 30 Å to about 50 Å. Substantially pure silicon may not have a good etch selectivity for materials that are commonly used to form dummy gates. As such, when capping layer 51 is formed of substantially pure silicon, dummy dielectric layer 58 may be formed over capping layer 51 as shown in FIGS. 7A and 7B.

In embodiments in which capping layer 51 is formed of SiON created by a thermal nitridation and oxide deposition process, for finFET devices formed to have 1.5V applied to the gate electrode to turn on the finFEt device, thickness T2 may be from about 25 Å to about 45 Å. For finFET devices formed to have 1.8V applied to the gate electrode to turn on the finFET device, thickness T2 may be from about 30 Å to about 50 Å. SiON may not have a good etch selectivity for materials that are commonly used to form dummy gates. As such, when capping layer 51 is formed of SiON, dummy dielectric layer 58 may be formed over capping layer 51 as shown in FIGS. 7A and 7B.

In embodiments in which capping layer 51 is formed of $AL_2O_3$, for finFET devices formed to have 1.5V applied to the gate electrode to turn on the finFET device, thickness T2 may be from about 25 Å to about 45 Å. For finFET devices formed to have 1.8V applied to the gate electrode to turn on the finFET device, thickness T2 may be from about 30 Å to about 50 Å. $AL_2O_3$ may have a good etch selectivity for materials that are commonly used to form dummy gates. As such, when capping layer 51 is formed of $AL_2O_3$, dummy dielectric layer 58 may be formed over capping layer 51 as shown in FIGS. 7A and 7B, or dummy dielectric layer 58 may not be formed in some embodiments.

In embodiments in which capping layer 51 is formed of $Si_3N_4$, for finFET devices formed to have 1.5V applied to the gate electrode to turn on the finFET device, thickness T2 may be from about 25 Å to about 45 Å. For finFET devices formed to have 1.8V applied to the gate electrode to turn on the finFET device, thickness T2 may be from about 30 Å to about 50 Å. $Si_3N_4$ may have a good etch selectivity for materials that are commonly used to form dummy gates. As such, when capping layer 51 is formed of $Si_3N_4$, dummy dielectric layer 58 may be formed over capping layer 51 as shown in FIGS. 7A and 7B, or dummy dielectric layer 58 may not be formed in some embodiments.

Figure 8A:
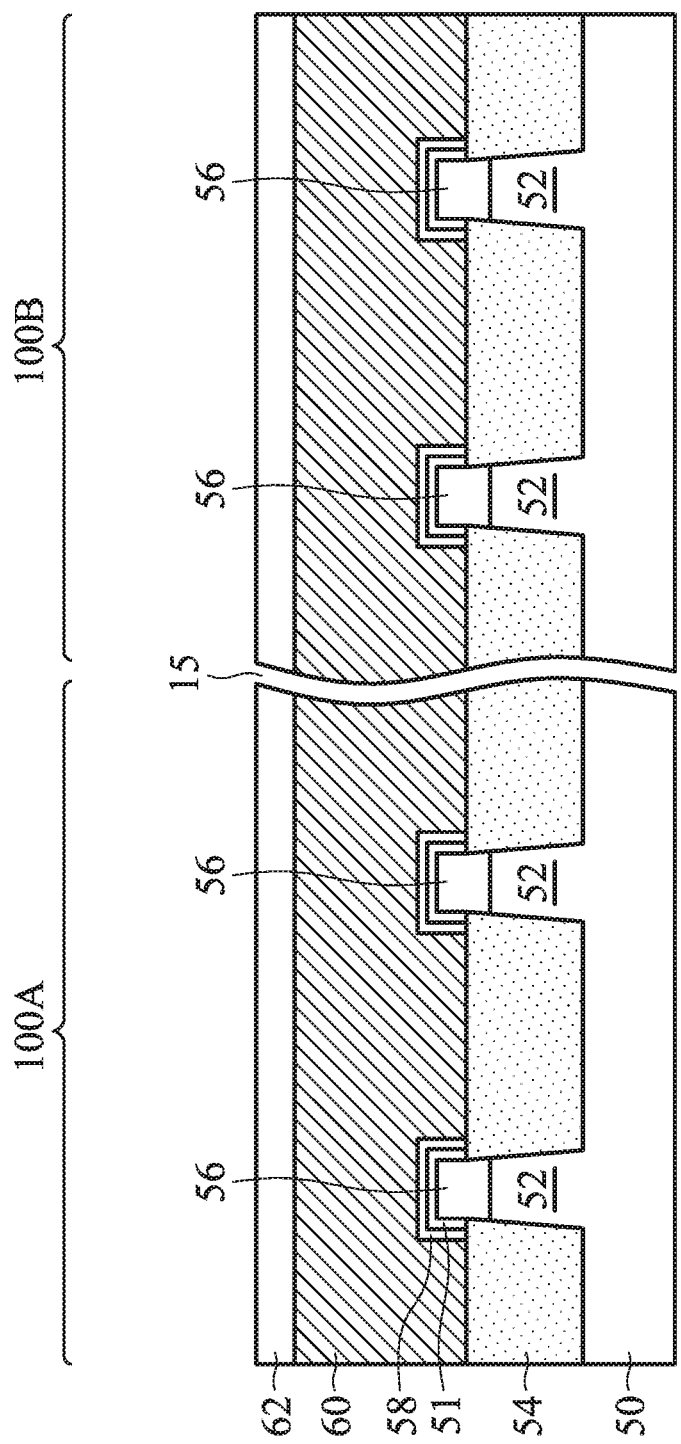
FIGS. 8A and 8B are cross-sectional views of intermediate stages in the manufacture of a finFET device in accordance with some embodiments.
Figure 8B:
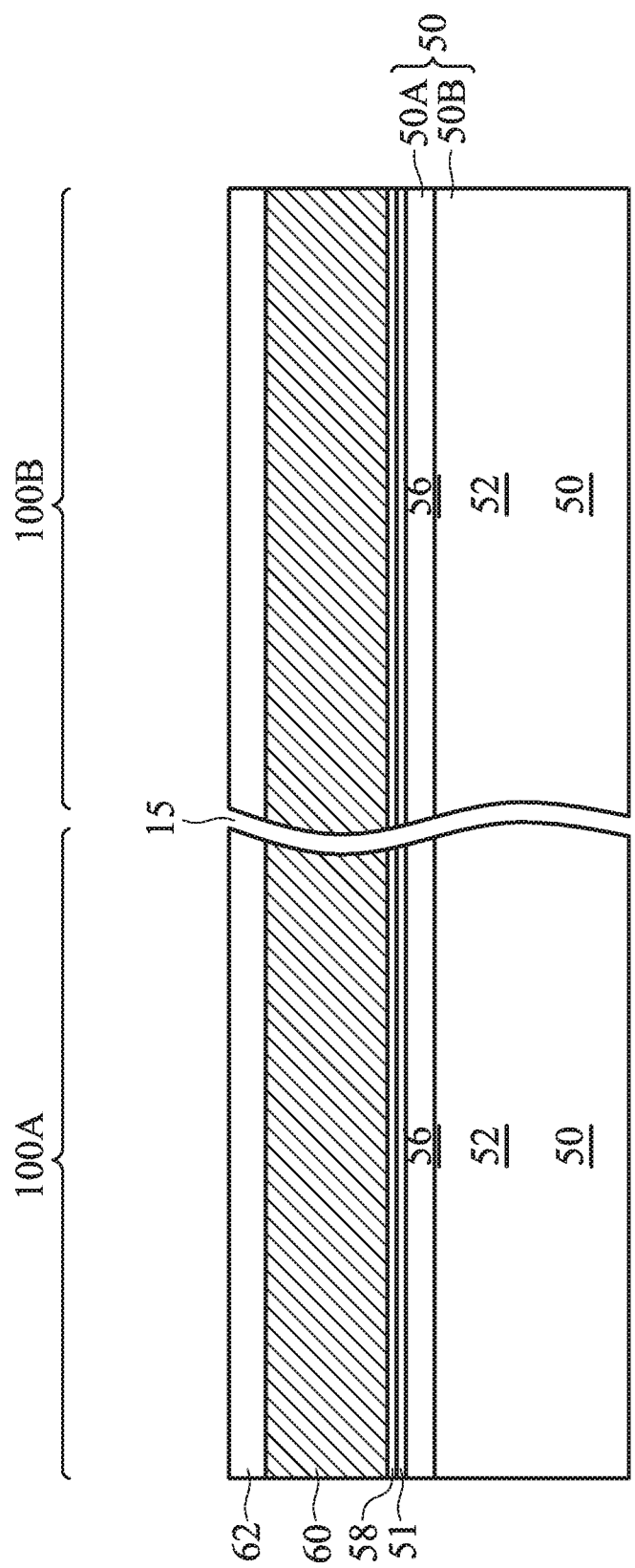

In FIGS. 8A and 8B, a dummy gate layer 60 is formed over the dummy dielectric layer 58, and a mask layer 62 is formed over the dummy gate layer 60. In embodiments in which dummy dielectric layer 58 is not formed, dummy gate layer 60 is formed directly over capping layer 51 (See FIGS. 9A-B). The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 100A and the second region 100B. In other embodiments, separate dummy gate layers may be formed in the first region 100A and the second region 100B, and separate mask layers may be formed in the first region 100A and the second region 100B.

Figure 9A:
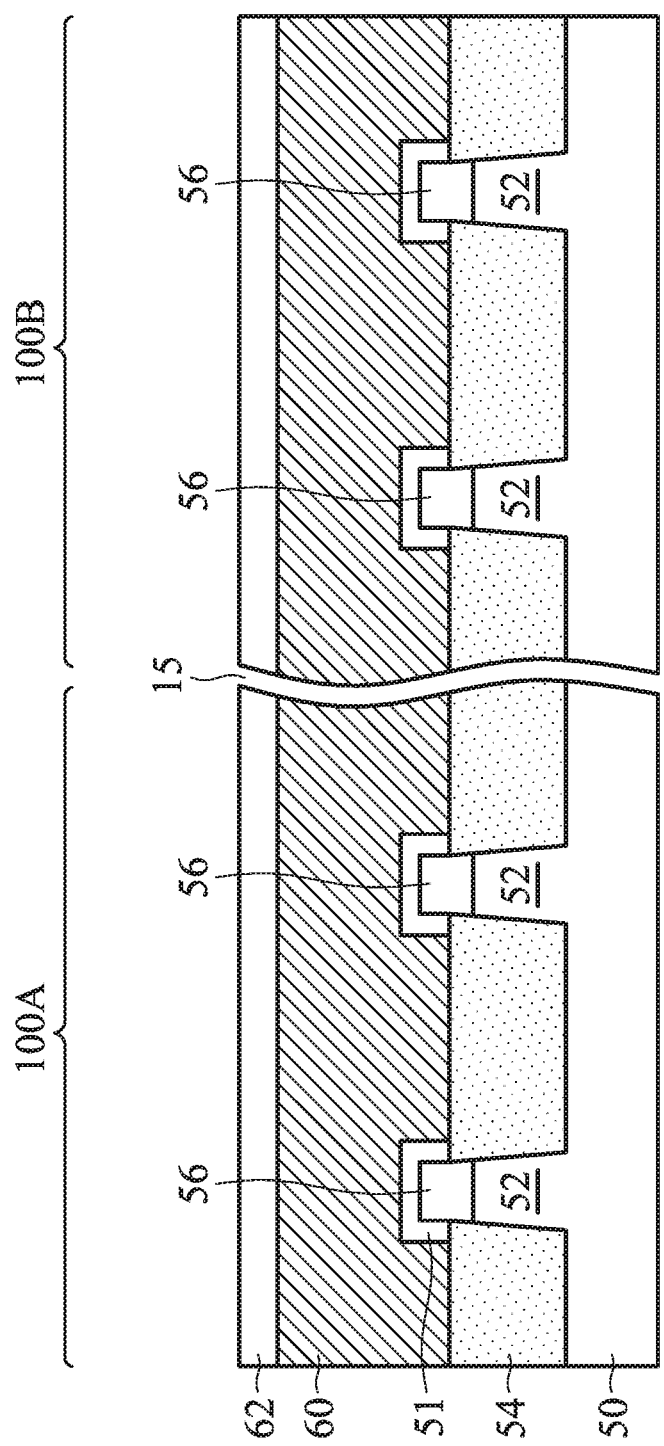
FIGS. 9A and 9B are cross-sectional views of intermediate stages in the manufacture of a finFET device in accordance with some embodiments.
Figure 9B:
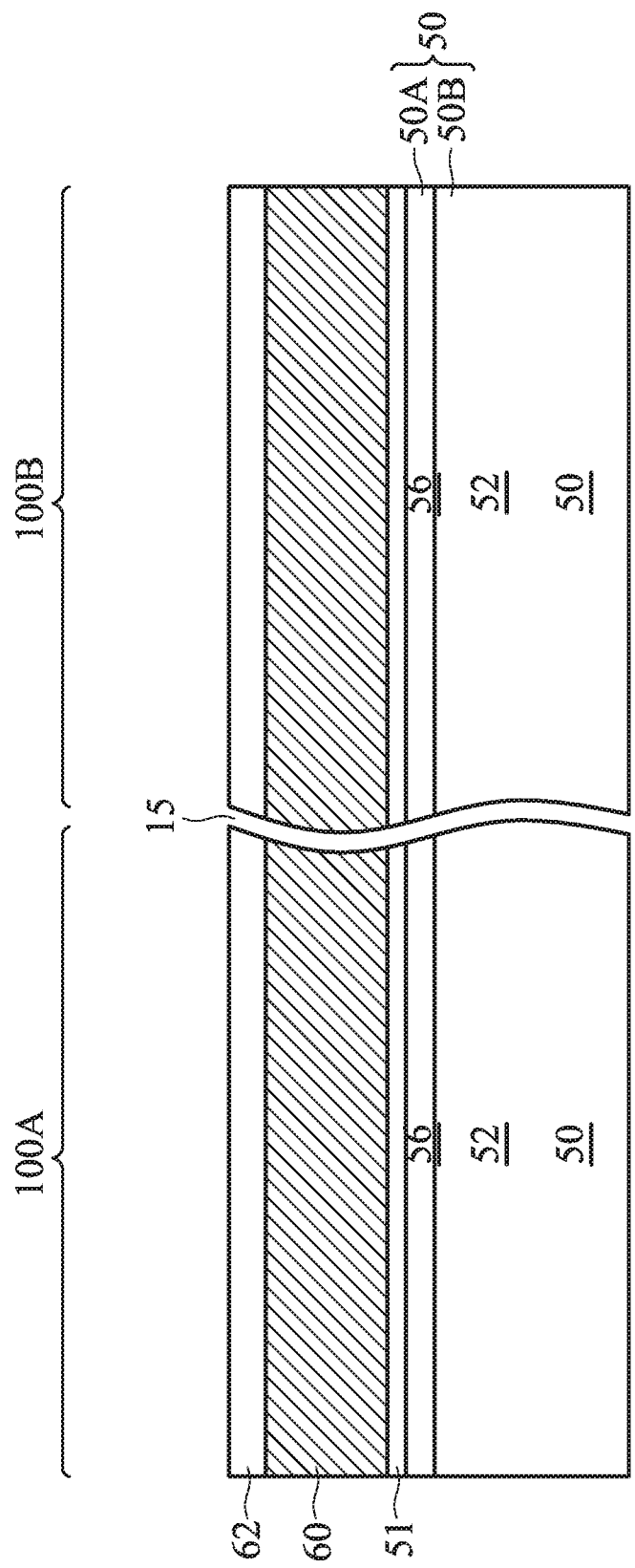

Referring to FIGS. 9A-B, as described above, in some embodiments dummy dielectric layer 58 may be optionally omitted. In embodiments in which dummy dielectric layer 58 is omitted, dummy gate layer 60 may be formed directly over capping layer 51.

Figure 10A:
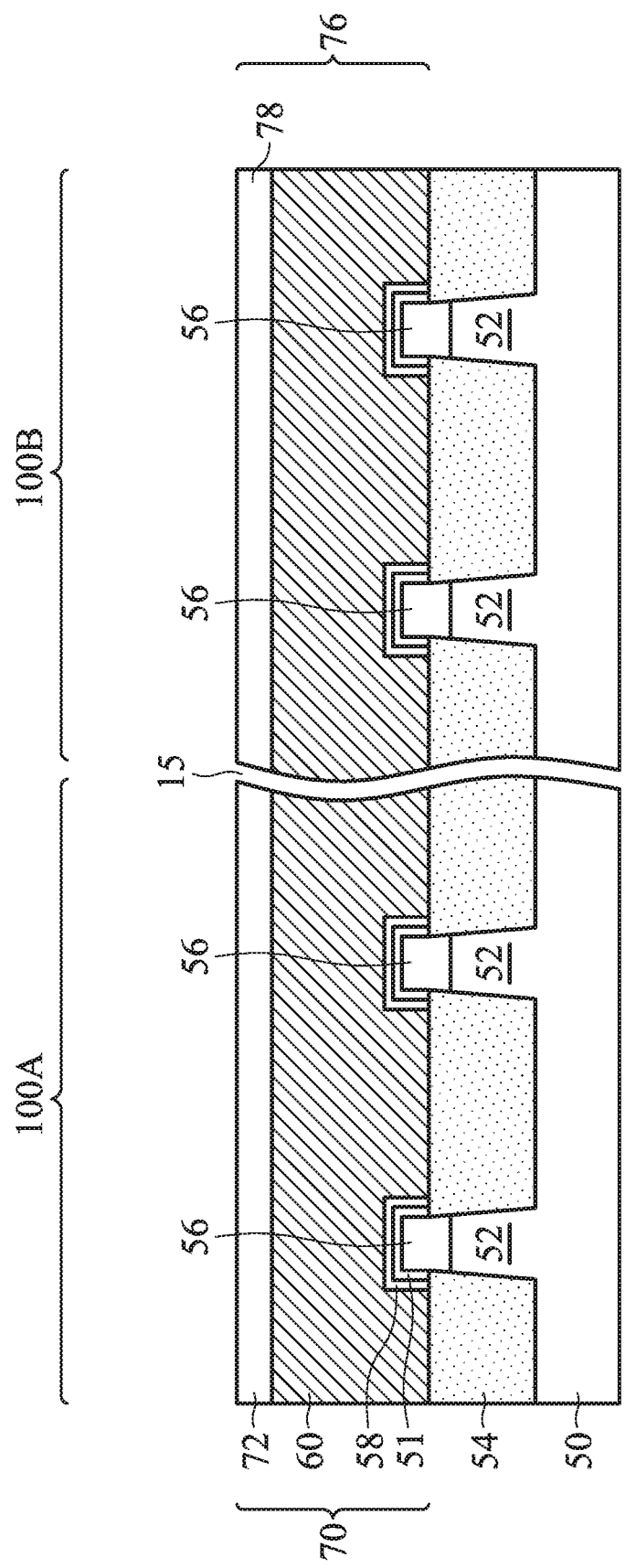
FIGS. 10A, 10B, and 10C are cross-sectional views of intermediate stages in the manufacture of a finFET device in accordance with some embodiments.
Figure 10B:
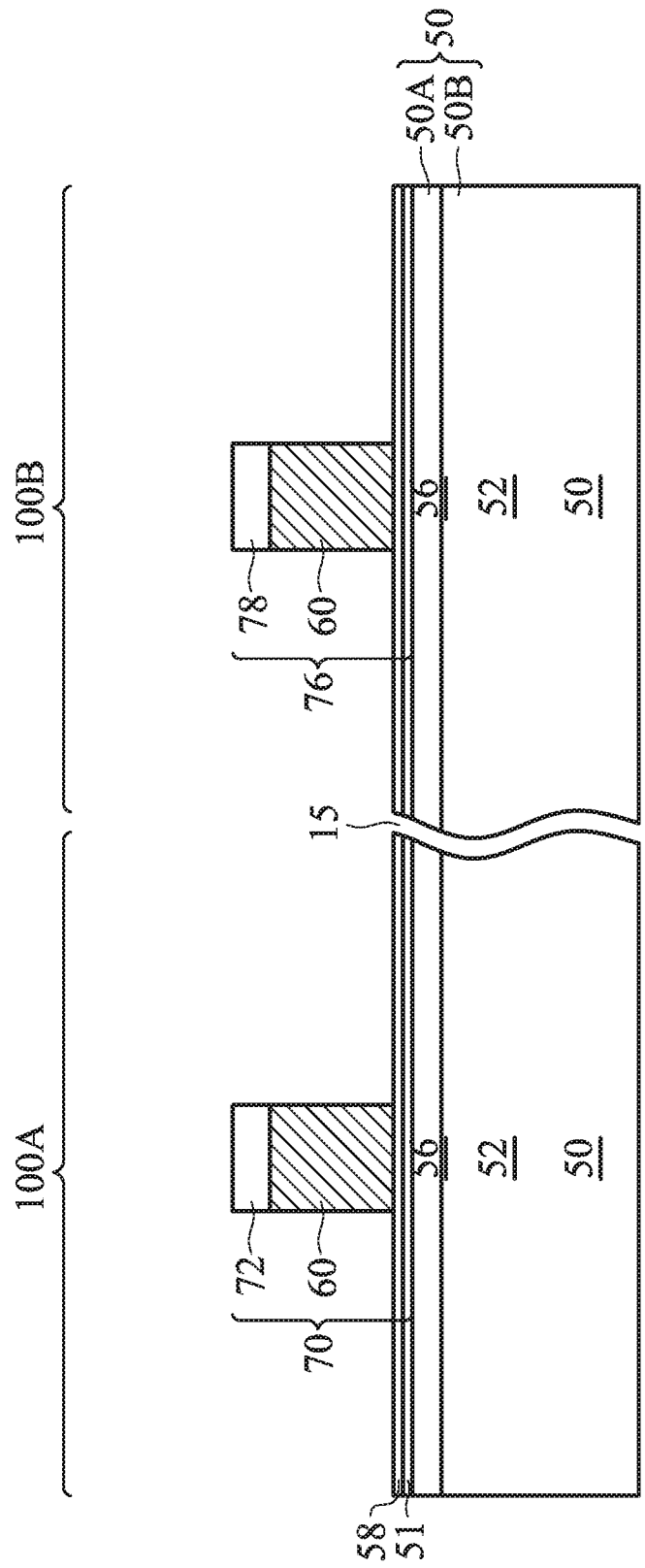
Figure 10C:
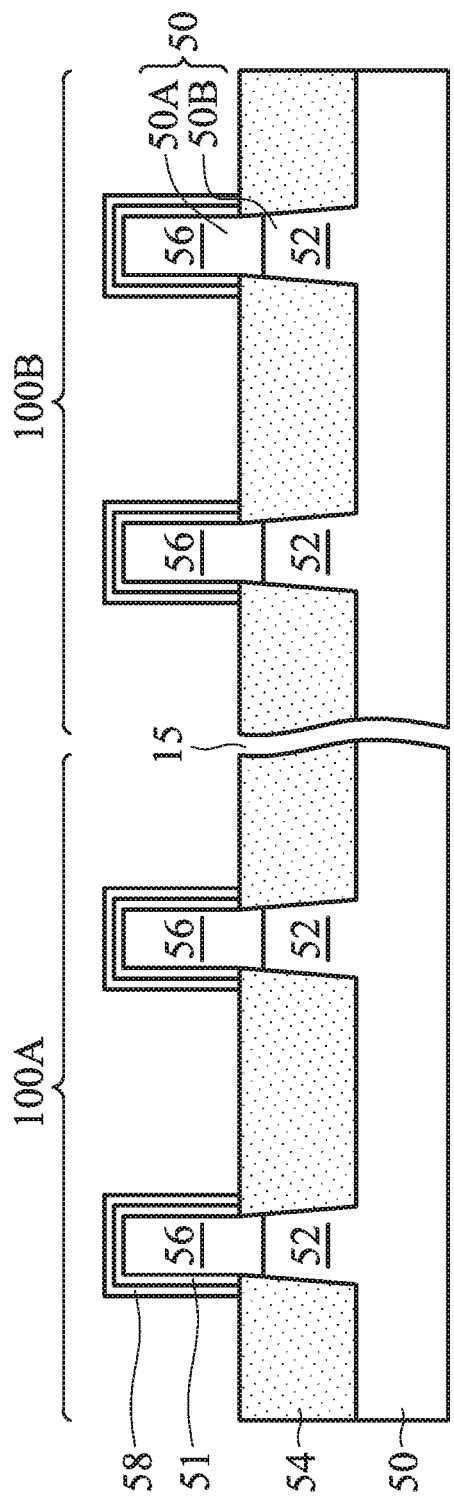

In FIGS. 10A, 10B, and 10C, the mask layer 62 may be patterned using acceptable photolithography and etching techniques to form mask 72 in the first region 100A and mask 78 in the second region 100B. The pattern of the masks 72 and 78 then may be transferred to the dummy gate layer 60 by an acceptable etching technique to form dummy gates 70 in the first region 100A and dummy gates 76 in the second region 100B. Optionally, the pattern of masks 72 and 78 may similarly be transferred to dummy dielectric layer 58. The dummy gates 70 and 76 cover respective channel regions of the fins 56. The dummy gates 70 and 76 may also have a lengthwise direction substantially perpendicular to the lengthwise direction of respective epitaxial fins.

Furthermore, although not explicitly illustrated, masks 72 and 78 may further be used to pattern dummy gate layer 60 and optionally dummy dielectric layer 58 in cross section A-A of FIGS. 1 and 10A. Specifically, the dummy gate layer 60 may be patterned to physically separate dummy gates of adjacent finFET devices within each region 100A and 100B. For example, dummy gates 70 and 76 may be physically separated from each other as well as dummy gates of adjacent finFET devices (not explicitly illustrated). In other embodiments, different masks (e.g., other than masks 72 and 78) may be used to pattern the dummy gate layer 60 in different cross sections (e.g., cross section A-A versus cross section B-B of FIGS. 1, 10A, and 10B). A size of the dummy gates 70 and 76, and a pitch between dummy gates 70 and 76, may depend on a region of a die in which the dummy gates are formed. In some embodiments, dummy gates 70 and 76 may have a larger size and a larger pitch when located in an input/output region of a die (e.g., where input/output circuitry is disposed) than when located in a logic region of a die (e.g., where logic circuitry is disposed).

In FIGS. 10A-C, appropriate wells (not shown) may be formed in the fins 56, semiconductor strips 52, and/or substrate 50. For example, a P well may be formed in the first region 100A, and an N well may be formed in the second region 100B.

The different implant steps for the different regions 100A and 100B may be achieved using a photoresist or other masks (not shown). For example, a photoresist is formed over the fins 56 and the isolation regions 54 in the second region 100B. The photoresist is patterned to expose the second region 100B of the substrate 50, such as a PMOS region. The photoresist can be formed by using a spin-on technique and can be patterned using acceptable photolithography techniques. Once the photoresist is patterned, an n-type impurity implant is performed in the second region 100B, and the photoresist may act as a mask to substantially prevent n-type impurities from being implanted into the first region 100A, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of the second region 100B, a photoresist is formed over the fins 56 and the isolation regions 54 in the second region 100B. The photoresist is patterned to expose the first region 100A of the substrate 50, such as the NMOS region. The photoresist can be formed by using a spin-on technique and can be patterned using acceptable photolithography techniques. Once the photoresist is patterned, a p-type impurity implant may be performed in the first region 100A, and the photoresist may act as a mask to substantially prevent p-type impurities from being implanted into the second region, such as the PMOS region. The p-type impurities may be boron, BF$_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of the first region 100A and the second region 100B, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 11A:
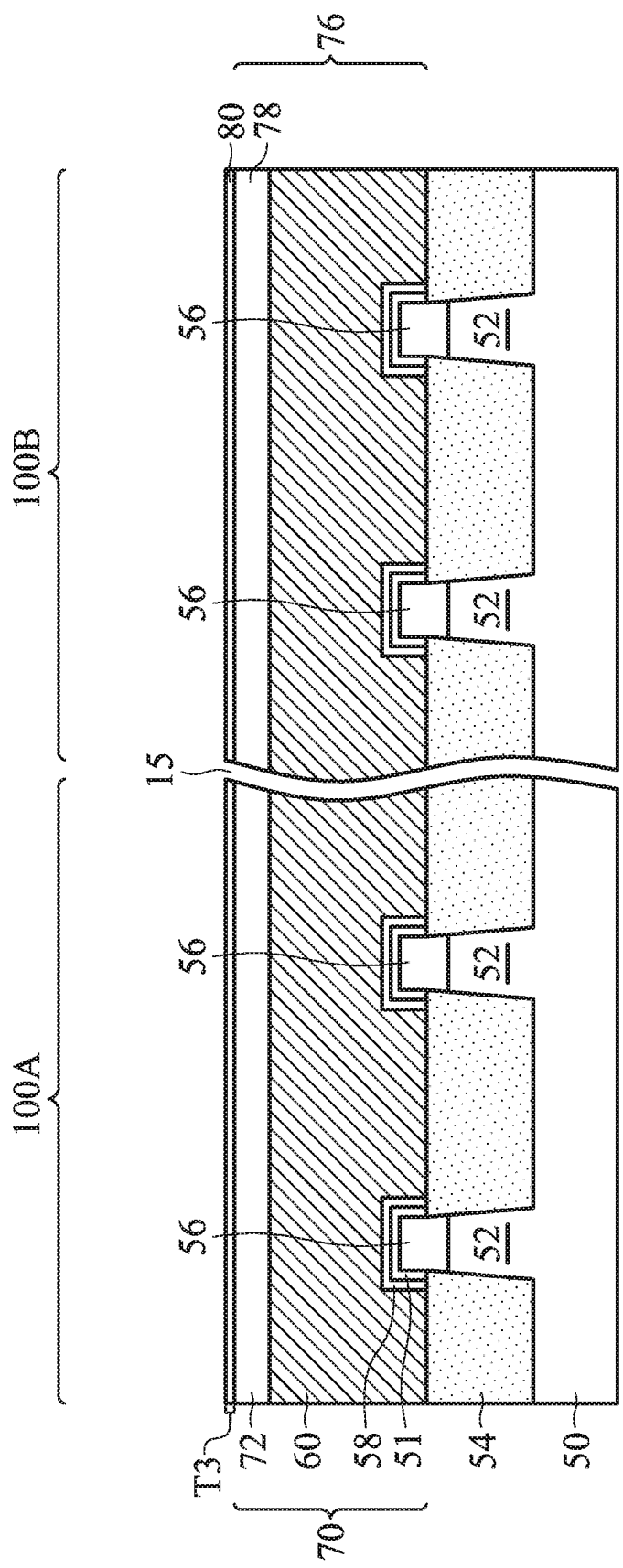
FIGS. 11A, 11B, and 11C are cross-sectional views of intermediate stages in the manufacture of a finFET device in accordance with some embodiments.
Figure 11B:
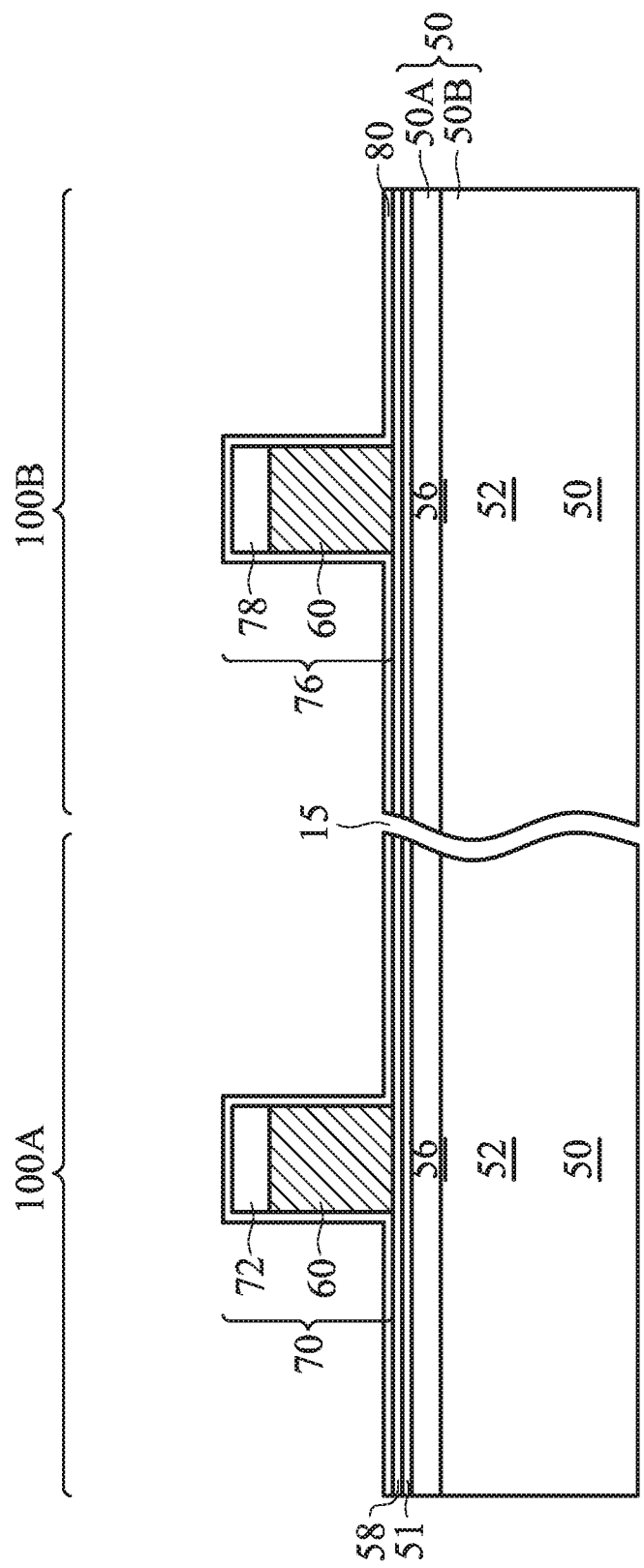
Figure 11C:
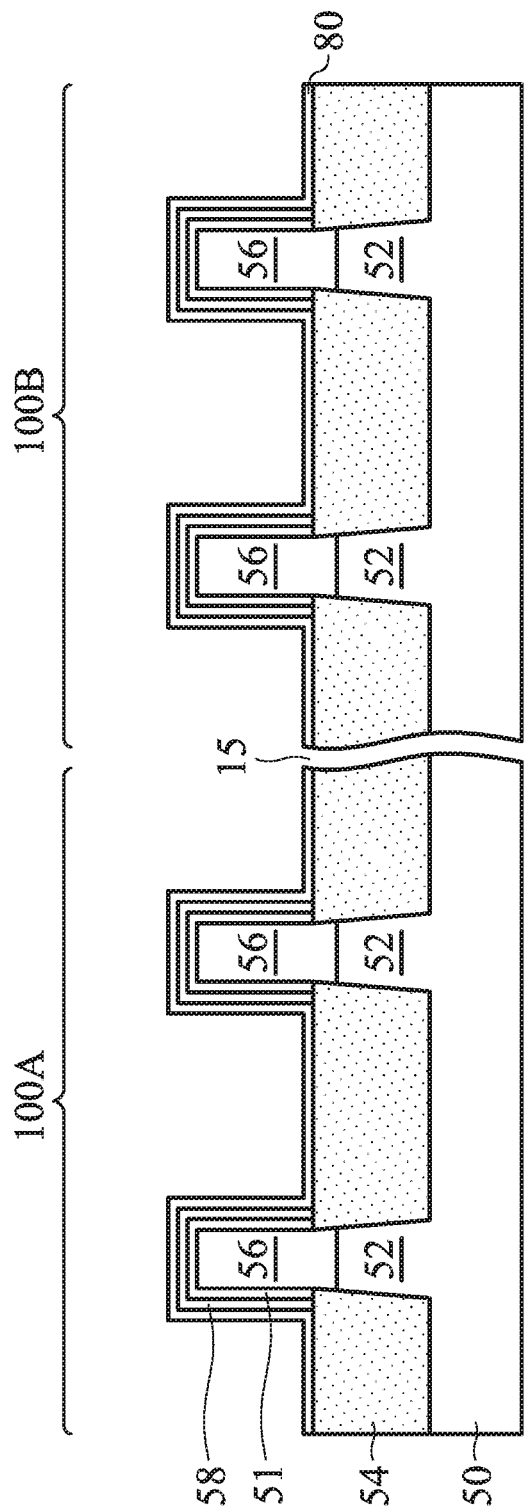

In FIGS. 11A, 11B, and 11C, a first gate spacer 80 is formed on exposed surfaces of respective dummy gates 70 and 76 (FIGS. 8A and 8B) and/or dummy dielectric layer 58 over fins 56 (FIG. 8C). Any suitable methods of forming gate spacers 80 may be used. In some embodiments, a deposition (such as CVD, ALD or the like) may be used form the first gate spacer 80. In some embodiments, as shown in FIG. 8A, first gate spacer may have a thickness T3 of about 30 Å. First gate spacer 80 may comprise any suitable material. In some embodiments, first gate spacer may comprise SiOCN.

Figure 12A:
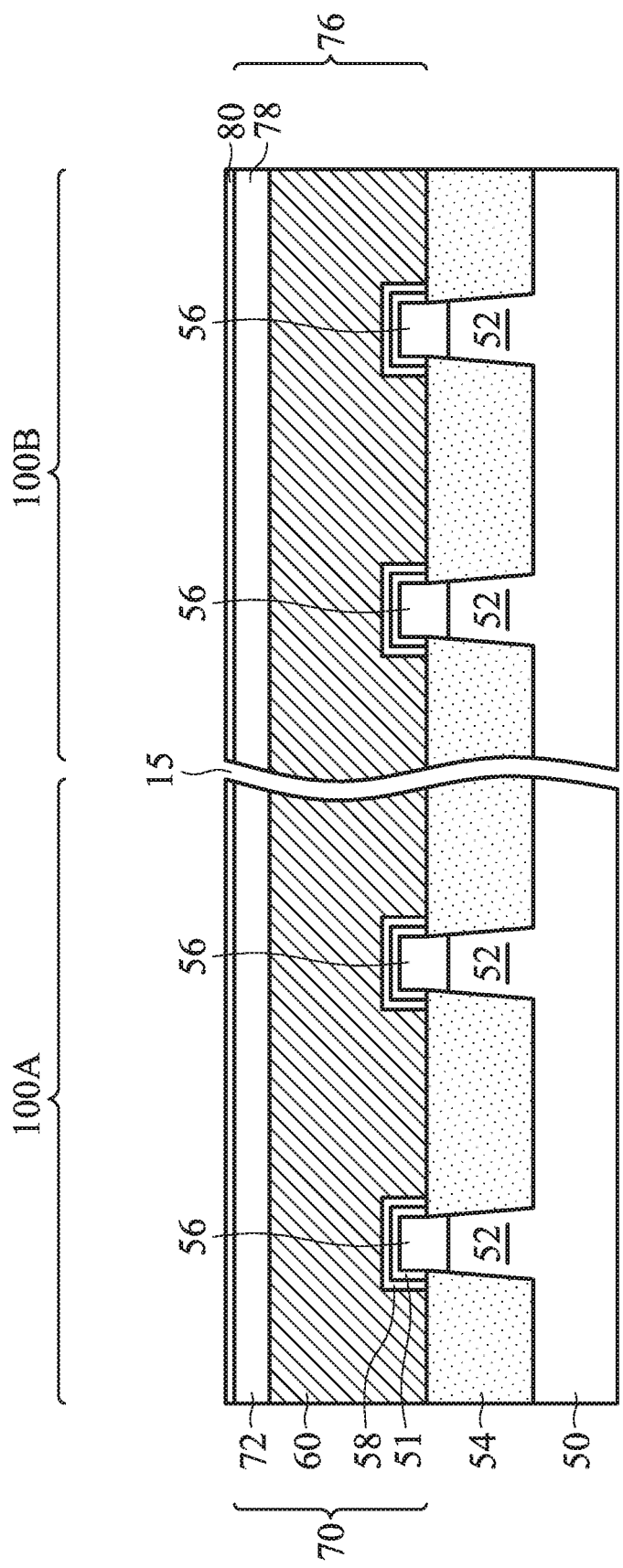
FIGS. 12A, 12B, and 12C are cross-sectional views of intermediate stages in the manufacture of a finFET device in accordance with some embodiments.
Figure 12B:
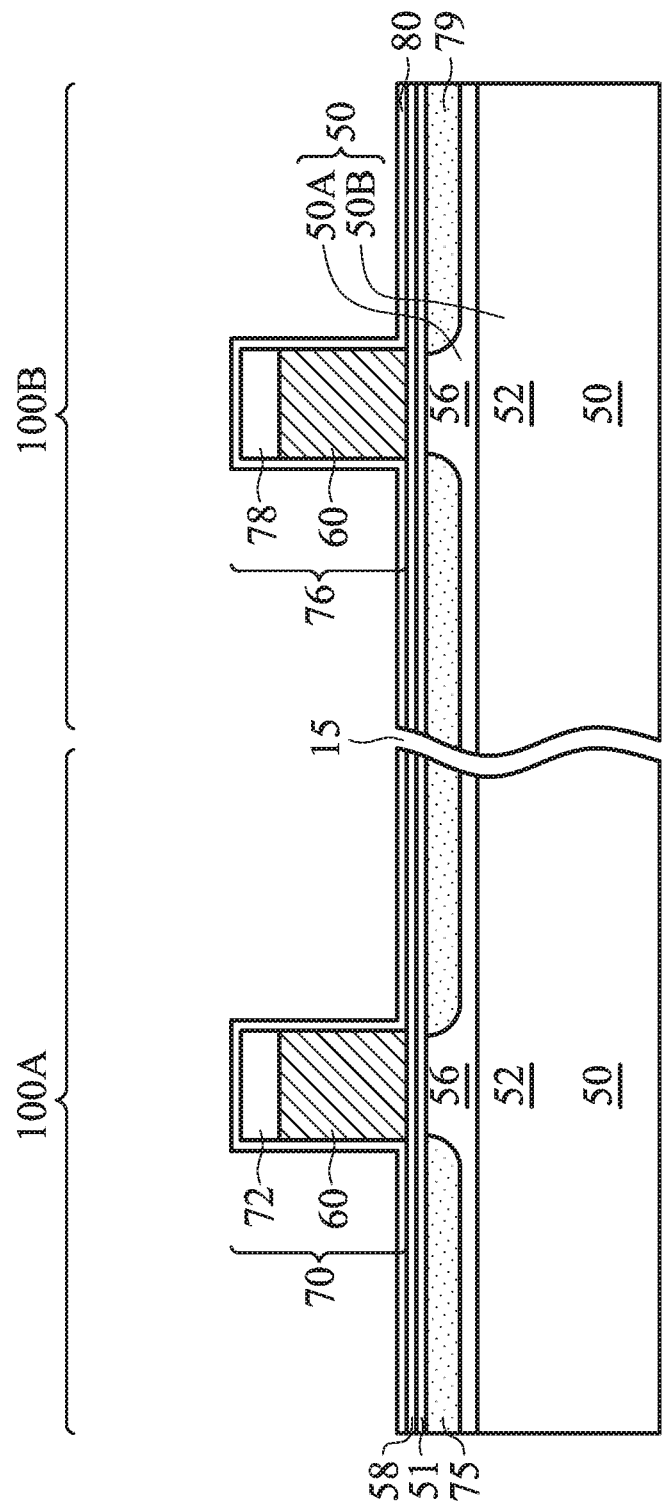
Figure 12C:
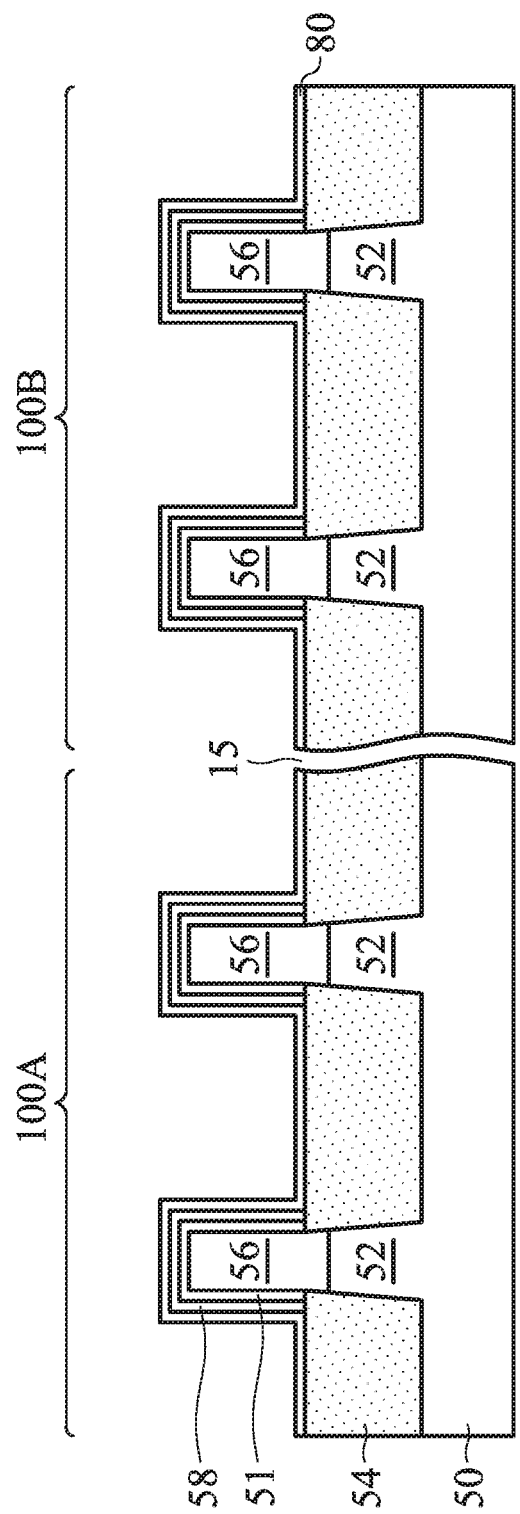

In FIGS. 12A, 12B and 12C, implants for lightly doped source/drain (LDD) regions 75 and 79 may be performed. Similar to the implants discussed above in FIGS. 7A, 7B and 7C, a mask (not shown), such as a photoresist, may be formed over the first region 100A, e.g., NMOS region, while exposing the second region 100B, e.g., PMOS region, and p-type impurities may be implanted into the exposed fins 56 in the second region 100B to created LDD regions 79. The mask may then be removed. Subsequently, a mask (not shown), such as a photoresist, may be formed over the second region 100B while exposing the first region 100A, and n-type impurities may be implanted into the exposed fins 56 in the first region 100A to create LDD regions 75. The mask may then be removed. The n-type impurities may be the any of the n-type impurities previously discussed, and the p-type impurities may be the any of the p-type impurities previously discussed. The LDD regions 75 and 79 may each have a concentration of impurities of from about $10^{15}$ cm$^{-3}$ to about $10^{16}$ cm$^{-3}$. An anneal may be used to activate the implanted impurities.

Figure 13A:
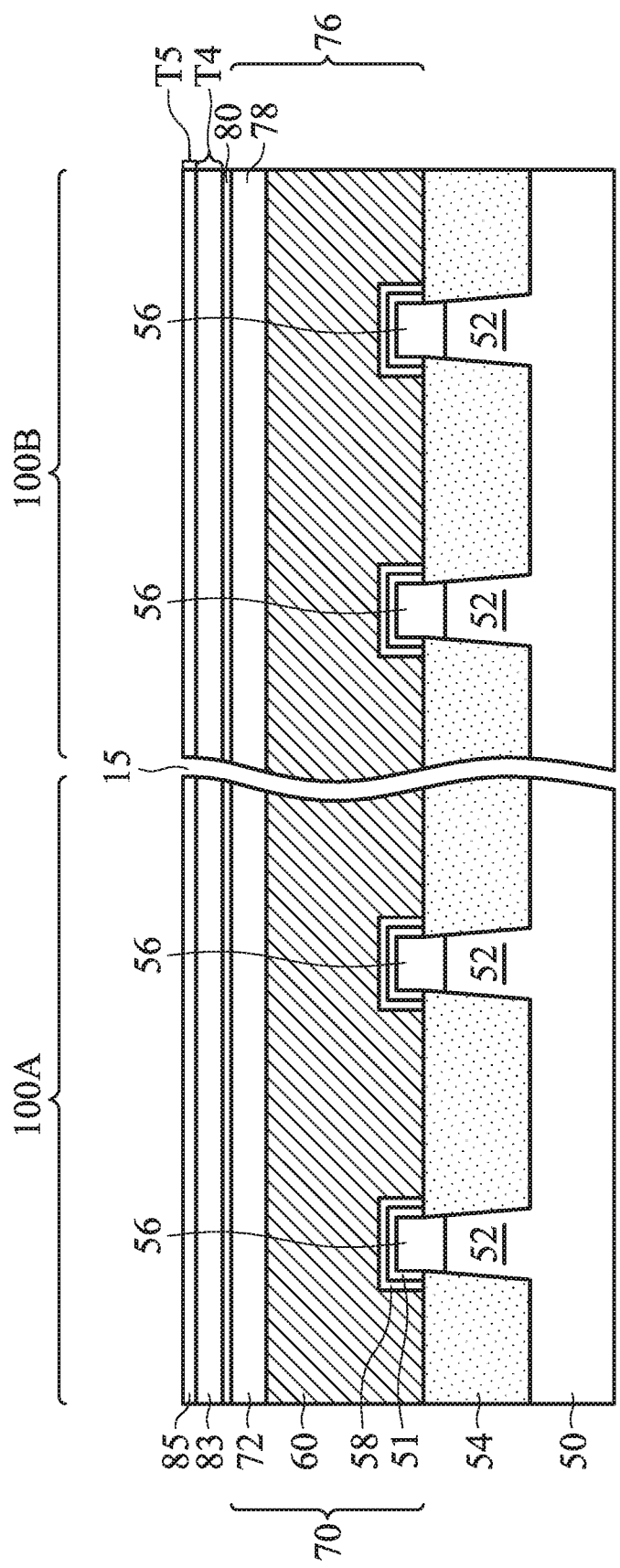
FIGS. 13A, 13B, and 13C are cross-sectional views of intermediate stages in the manufacture of a finFET device in accordance with some embodiments.
Figure 13B:
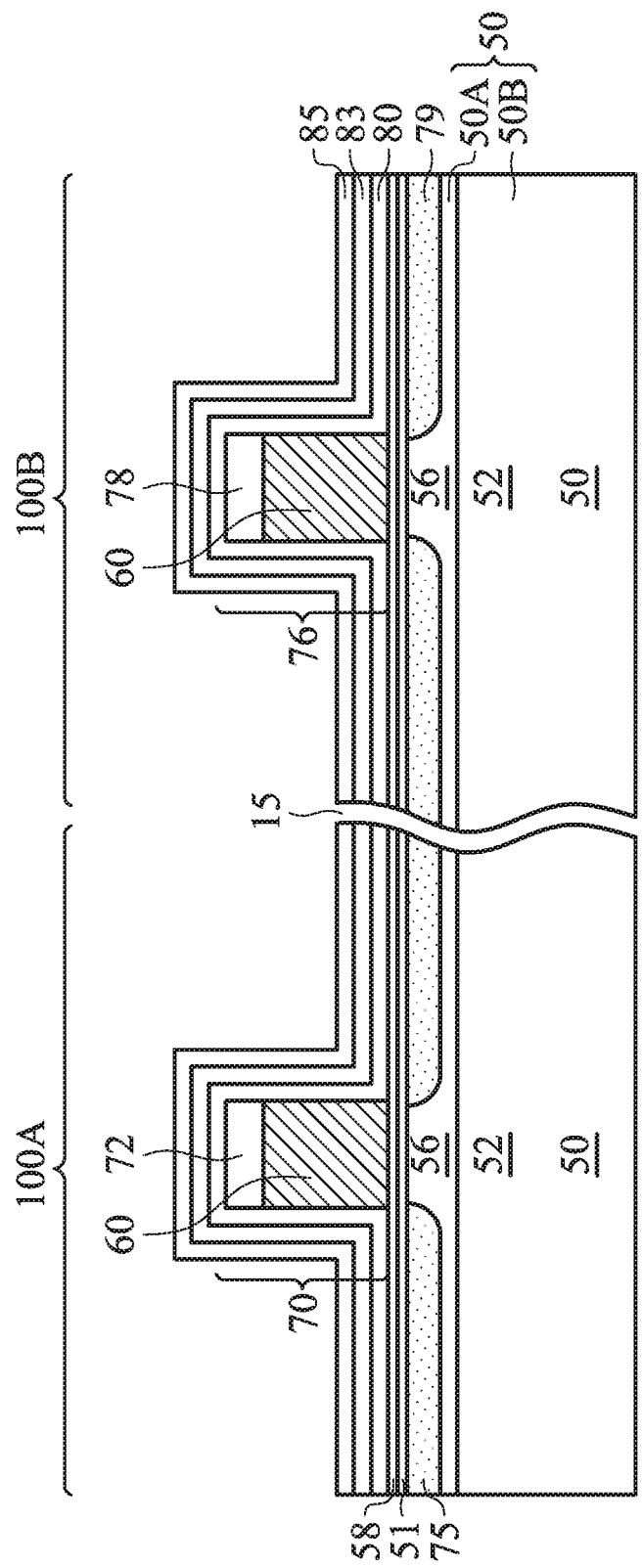
Figure 13C:
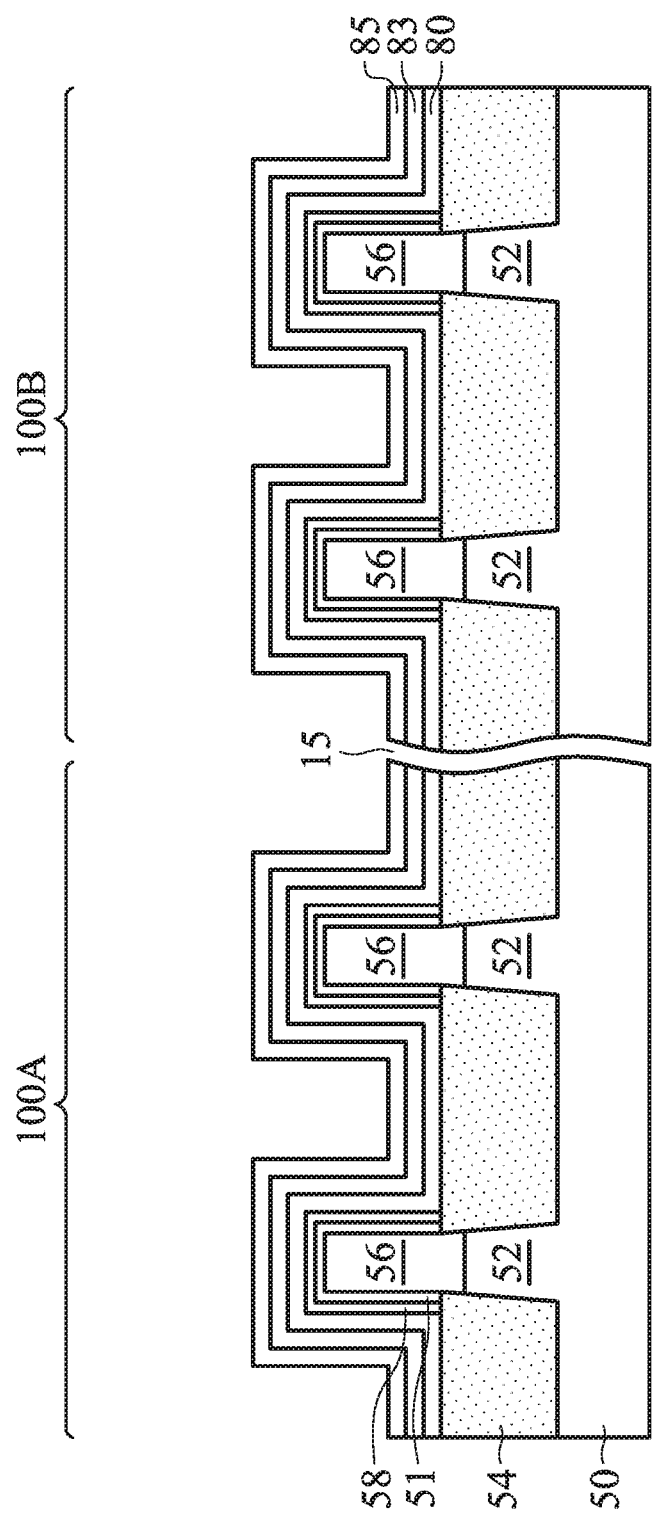

Referring to FIGS. 13A-C, additional gate spacers may be formed over gate spacer 80. First, second gate spacer 83 may be formed over first gate spacer 80. Any suitable methods of forming second gate spacer 83 may be used. In some embodiments, a deposition (such as ALD, CVD, or the like) may be used form second gate spacer 83. Any suitable material may be used to form second gate spacer 83. In some embodiments, second gate spacer 83 may comprise SiOCN. As shown in FIG. 13A, in some embodiments second gate spacer 83 may have a thickness T4 of about 30 Å. After second gate spacer 83 is formed, third gate spacer 85 is formed over second gate spacers 83. Any suitable methods of forming third gate spacer 85 may be used. In some embodiments, a deposition (such as ALD, CVD, or the like) may be used form third gate spacers 85. Any suitable material may be used to form third gate spacer 85. In some embodiments, third gate spacer 85 may comprise SiN. Third gate spacer 85 may have a thickness T5 of about 40 Å in some embodiments, as shown in FIG. 13A. More or less spacers may be used.

Figure 14A:
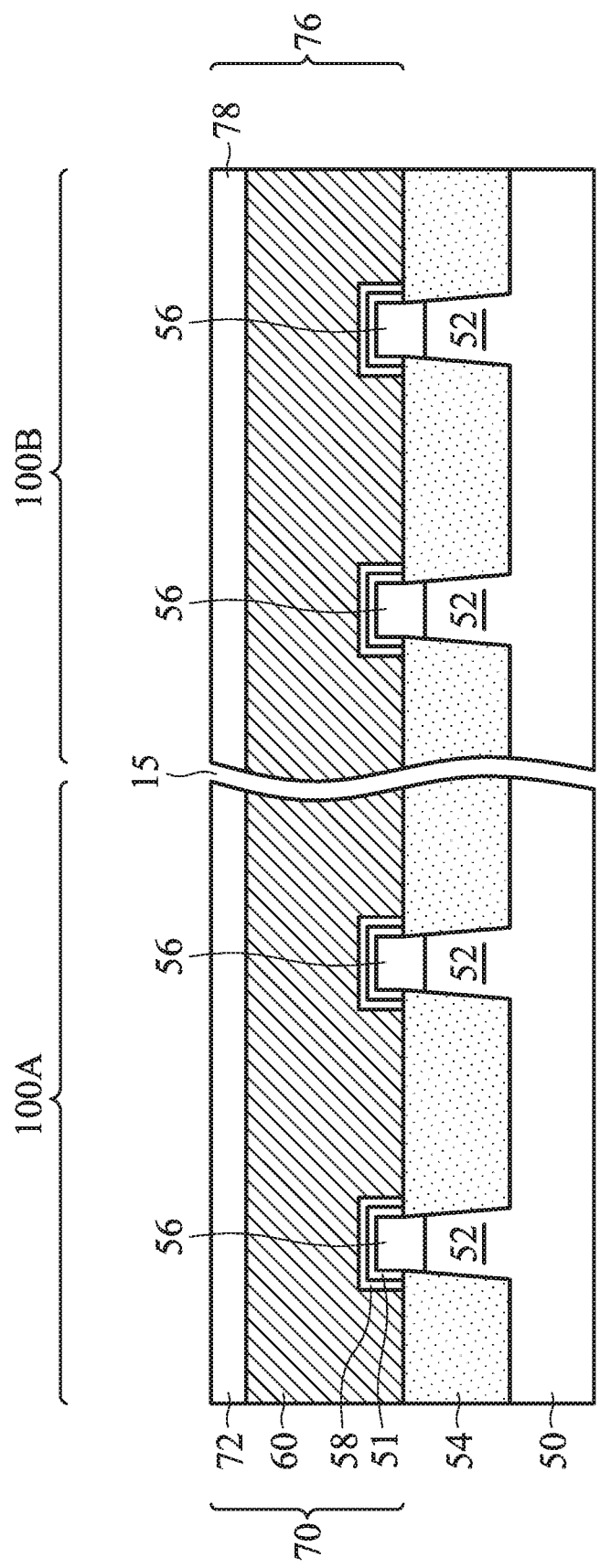
FIGS. 14A, 14B, and 14C are cross-sectional views of intermediate stages in the manufacture of a finFET device in accordance with some embodiments.
Figure 14B:
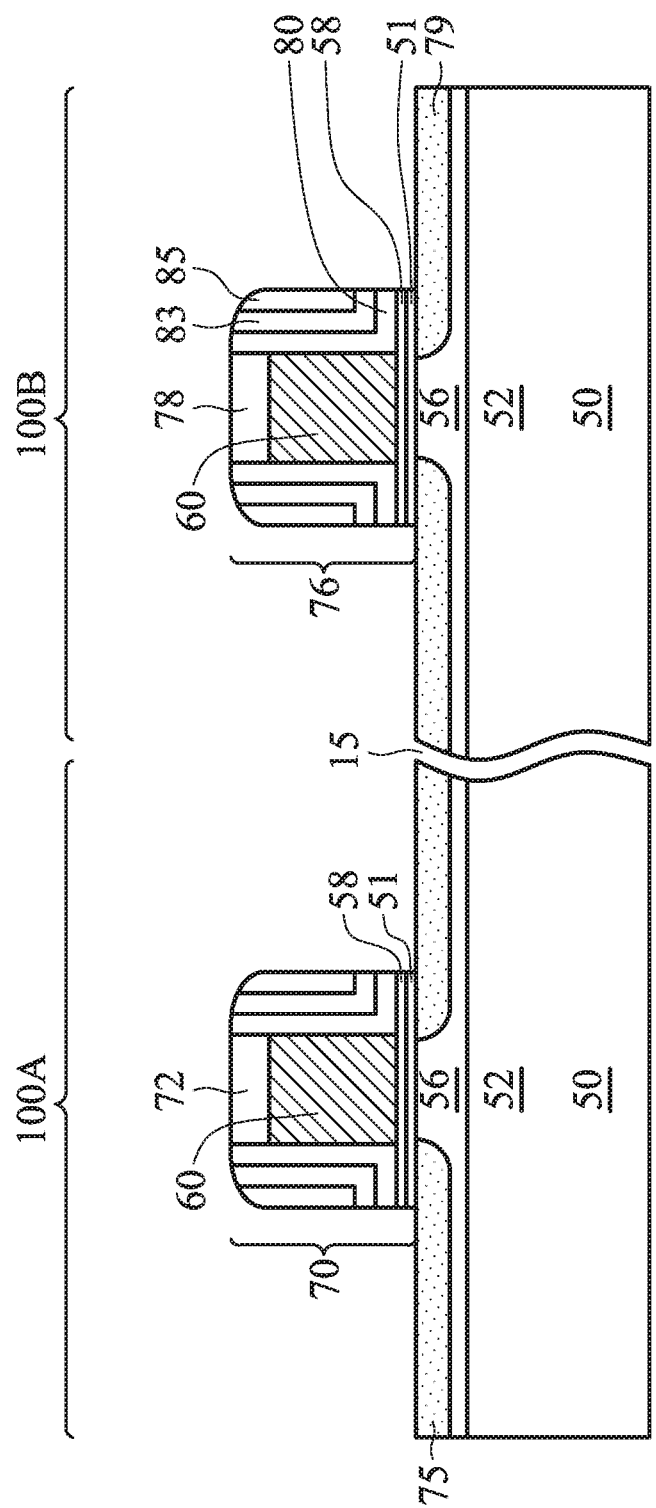
Figure 14C:
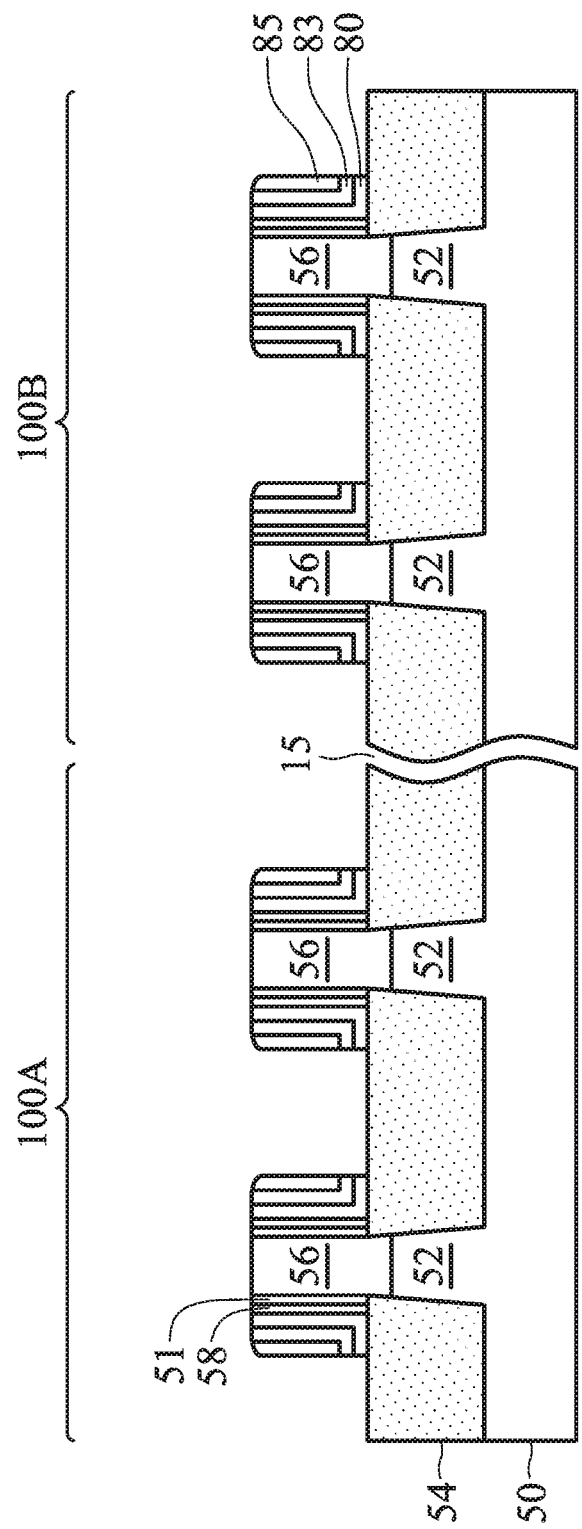

Next, a patterning process is performed to remove excess sections of first gate spacer 80, second gate spacer 83 and third gate spacer 85. Any acceptable patterning process may be used. In some embodiments a photoresist may be deposited (not shown) and patterned using acceptable lithograph techniques, where openings in the photo resist expose sections of first gate spacer 80, second gate spacer 83 and third gate spacer 85 to be removed. An etching process may be performed using the photoresist as a mask. The etching process may be anisotropic. After the etching, sections of first gate spacer 80, second gate spacer 83 and third gate spacer 85 over LDD regions and over isolation regions 54 may be removed. The resulting structure is depicted in FIGS. 14A-C.

FIGS. 15A-C through 20 depict the formation of epitaxial source/drain regions 82 and 84 in first region 100A and second region 100B. In some embodiments, epitaxial source/drain regions 82 in first region 100A may be formed before epitaxial source/drain regions 84 are formed in second region 100B. It is also possible to form epitaxial source/drain regions 84 in second region 100B before forming epitaxial source/drain regions 82 in first region 100A.

FIGS. 15A-C through 17 depict the formation of an epitaxial source/drain region in first region 100A. During the formation of the epitaxial source/drain region in first region 100A, e.g., the NMOS region, the second region 100B, e.g., the PMOS region may be masked (not shown).

Figure 15A:
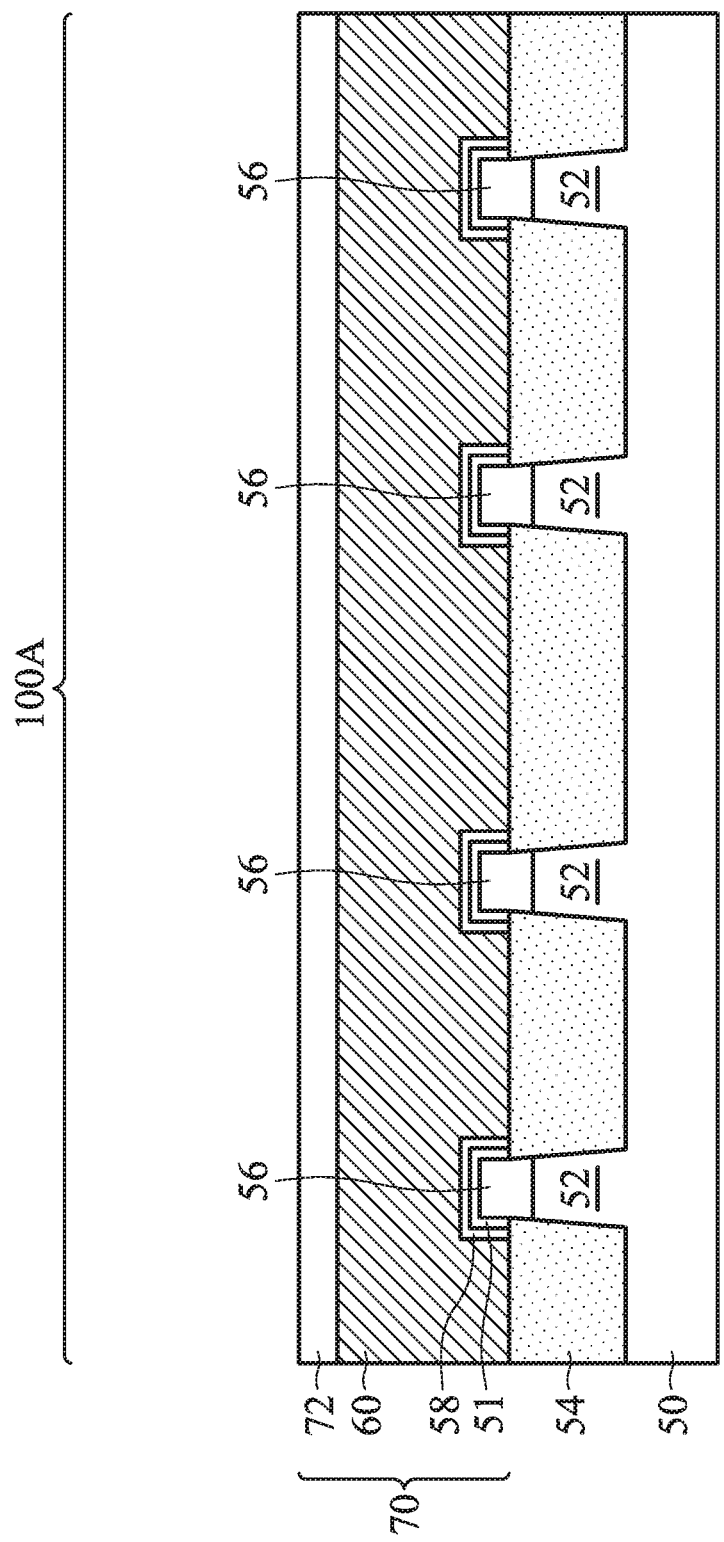
FIGS. 15A, 15B and 15C are cross-sectional views of an intermediate stages in the manufacture of a finFET device in accordance with some embodiments.
Figure 15B:
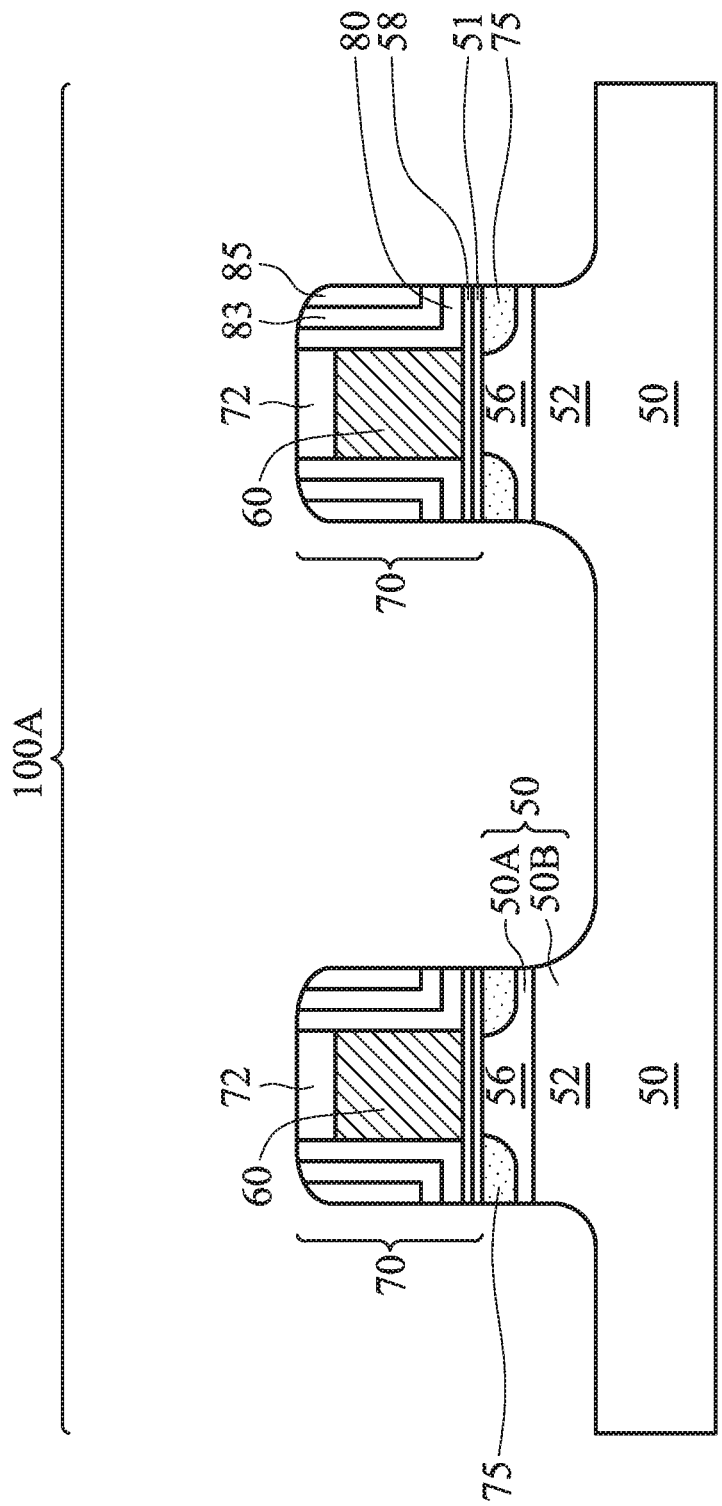
Figure 15C:
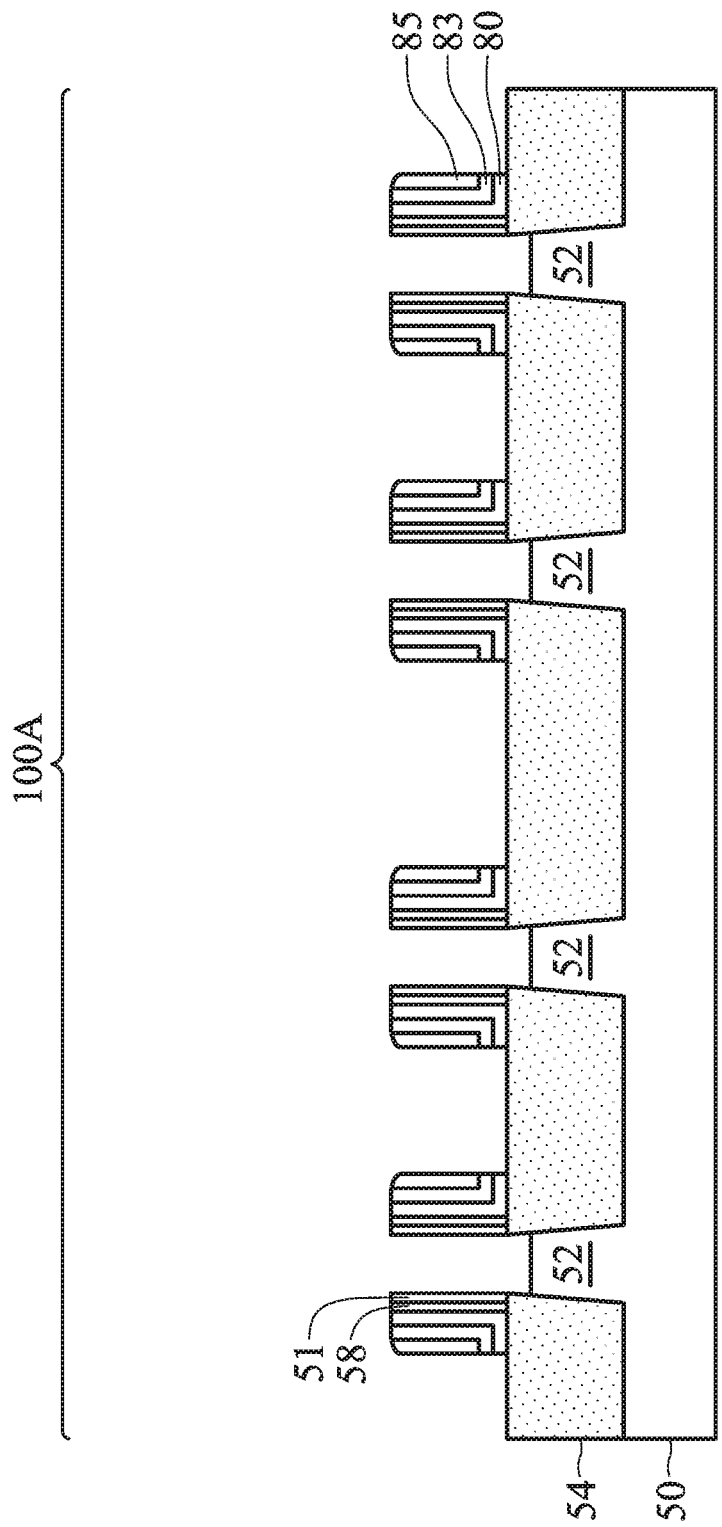

Referring to FIGS. 15A-C, source/drain regions of the fins 56 in the first region 100A are etched to form recesses. The etching may be performed in a manner that a recess is formed between neighboring dummy gates 70. Any acceptable etching process may be used, and may include one or more etching processes.

Figure 16A:
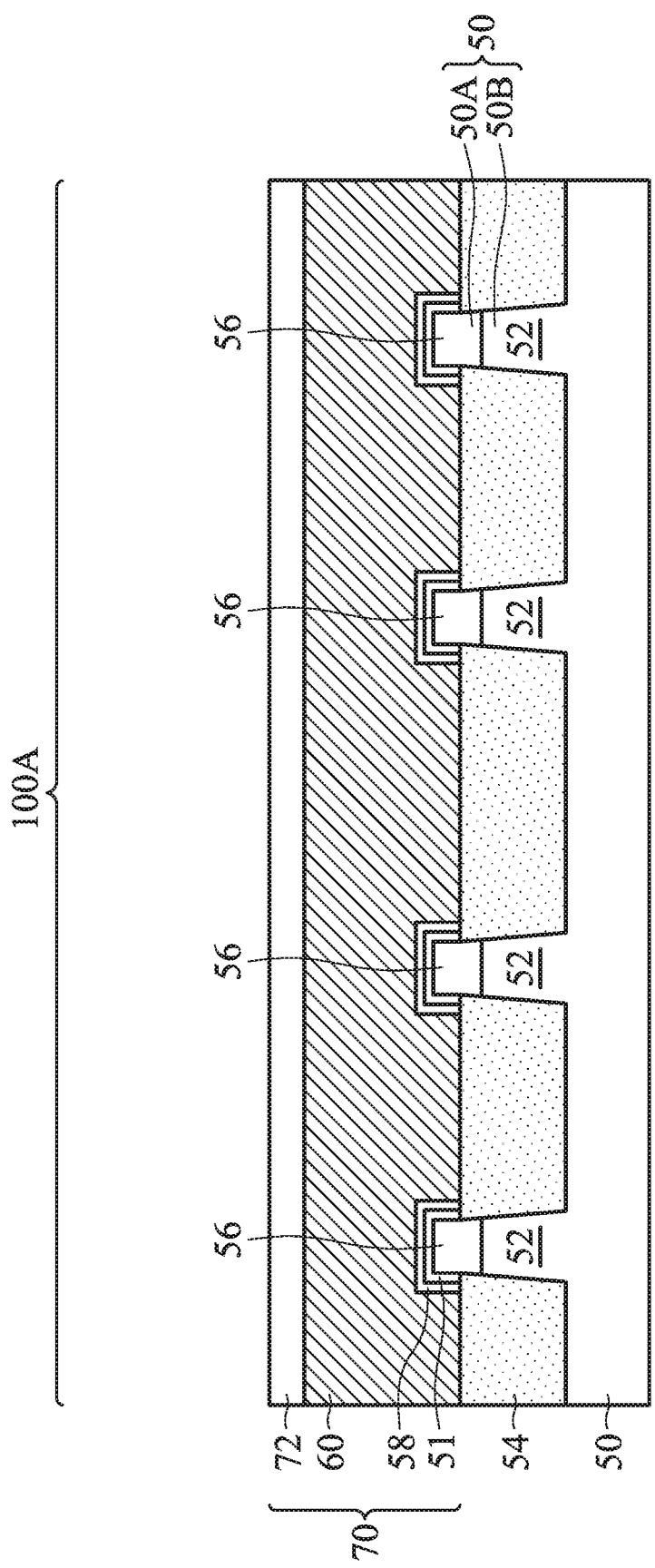
FIGS. 16A, 16B, and 16C are cross-sectional views of intermediate stages in the manufacture of a finFET device in accordance with some embodiments.
Figure 16B:
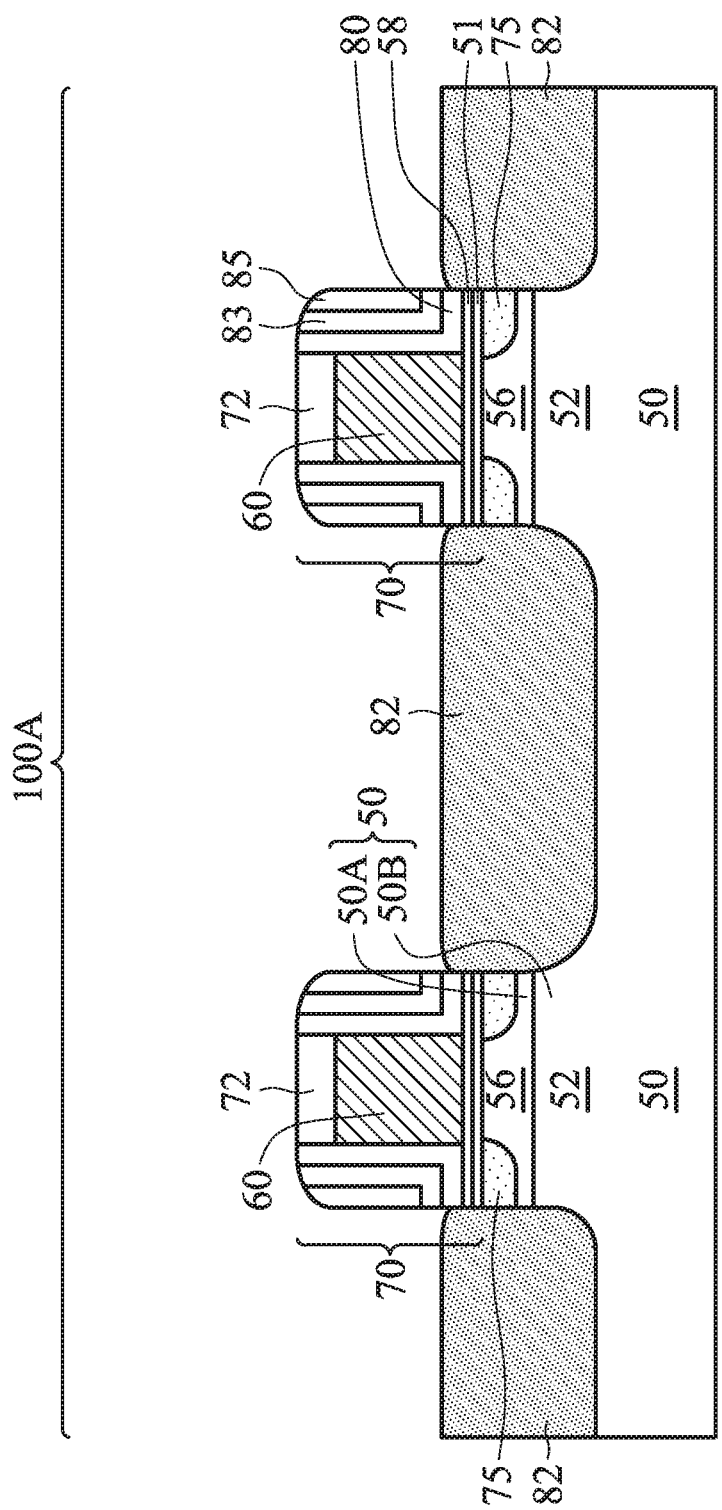
Figure 16C:
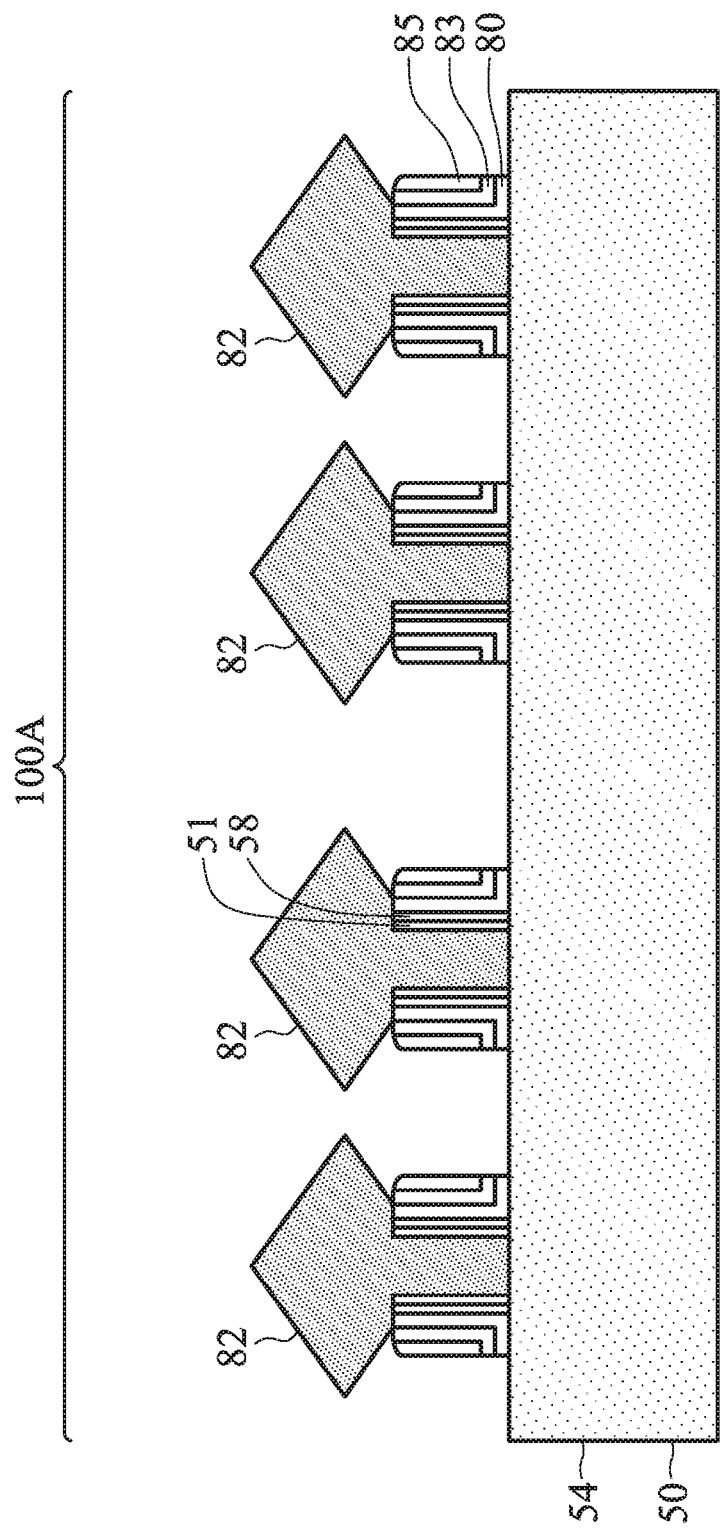
Figure 17:
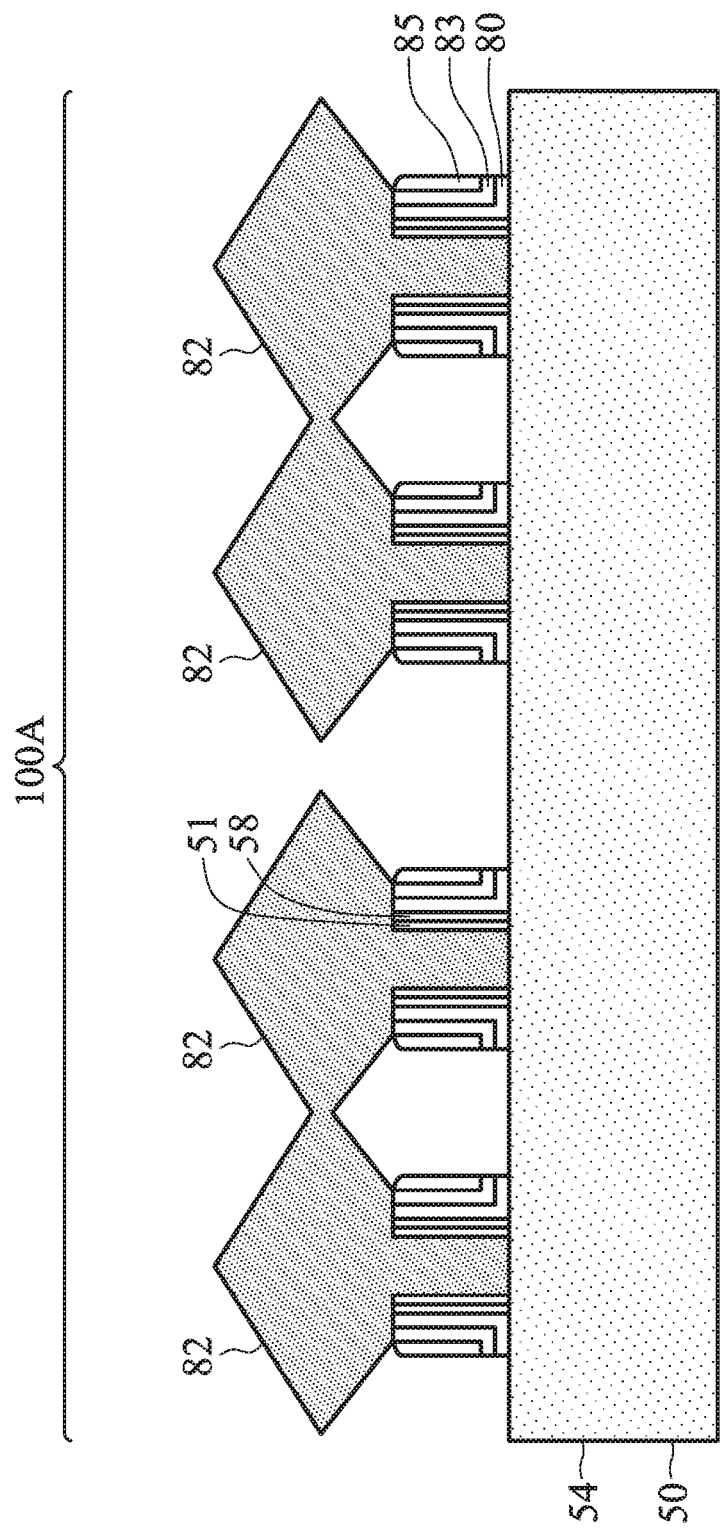
FIG. 17 is a cross-sectional view of an intermediate stage in the manufacture of a finFET device in accordance with some embodiments.

Next, as shown in FIGS. 16A-C, epitaxial source/drain regions 82 in the first region 100A are epitaxially grown in the recesses. The epitaxial source/drain regions 82 may include any acceptable material, such as any material that is appropriate for n-type FinFETs. For example, if the fin 56 comprises silicon, the epitaxial source/drain regions 82 may include silicon, SiC, SiCP, SiP, or the like. The epitaxial source/drain regions 82 may have surfaces raised from respective surfaces of the fins 56 and may have facets. Epitaxial source/drain regions 82 are formed in the fins 56 such that each dummy gate 70 is disposed between respective neighboring pairs of the epitaxial source/drain regions 82 (as depicted in FIG. 14B). In some embodiments the epitaxial source/drain regions 82 may extend past fins 56 and into the semiconductor strips 52.

The epitaxial source/drain regions 82 in the first region 100A may be implanted with dopants to form source/drain regions, similar to the process previously discussed for forming lightly doped source/drain regions, followed by an anneal. The source/drain regions 82 may have an impurity concentration of in a range from about $10^{19}$ cm$^{-3}$ to about $10^{21}$ cm$^{-3}$. The n-type impurities for source/drain regions in the first region 100A, e.g., the NMOS region, may be any of the n-type impurities previously discussed. In other embodiments, the epitaxial source/drain regions 82 may be in situ doped during growth.

FIGS. 16A-C depict embodiments of epitaxial source/drain regions 82 in which each source/drain region 82 is physically separate from other source/drain regions 82. In some embodiments, two or more adjacent source/drain regions 82 may be merged. An embodiment of a finFET having merged source/drain regions is depicted in FIG. 17, which is taken along the C-C cross-section of FIG. 1. In FIG. 17, two adjacent source/drain regions 82 are merged. In some embodiments, more than two adjacent source/drain regions 82 may be merged.

FIGS. 18A-C through 20 depict the formation of epitaxial source/drain regions in second region 100B. During the formation of the epitaxial source/drain region in second region 100B, e.g., the PMOS region, the first region 100A, e.g., the NMOS region may be masked (not shown).

Figure 18A:
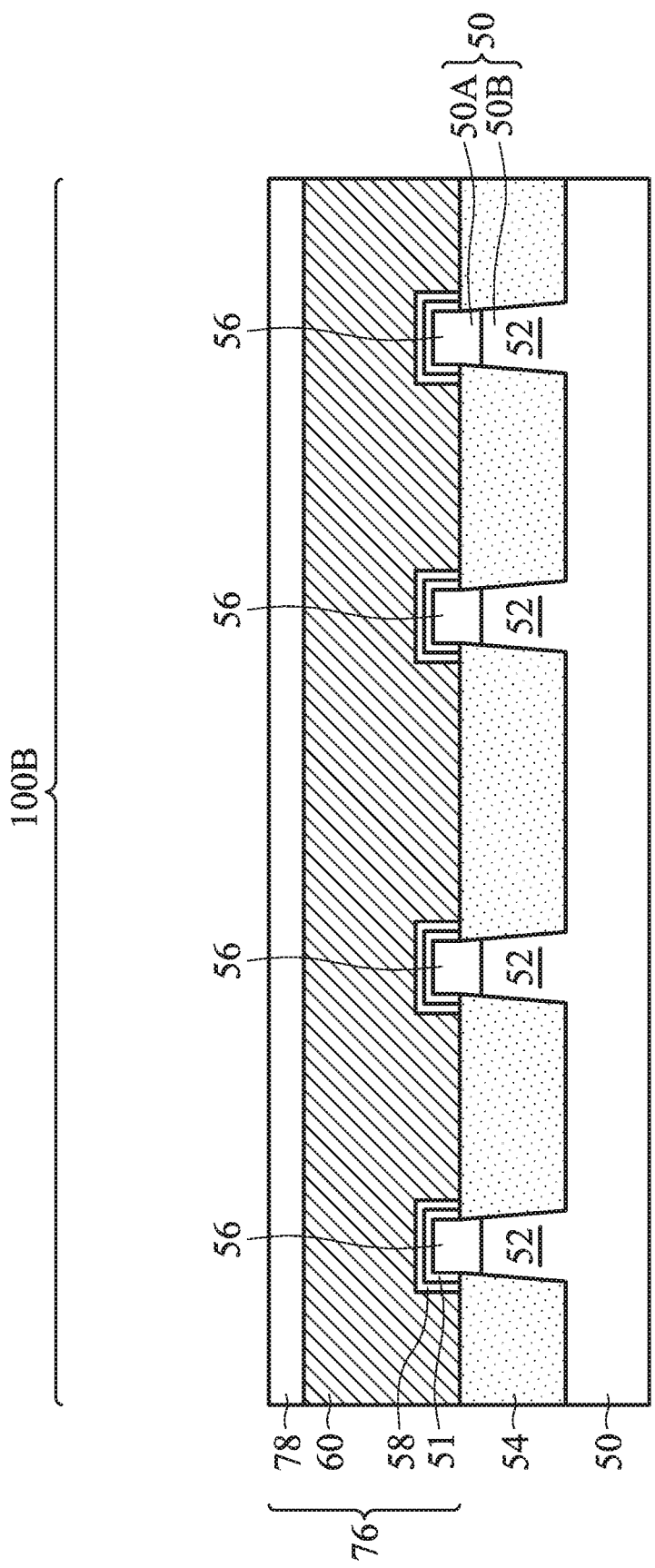
Figure 18B:
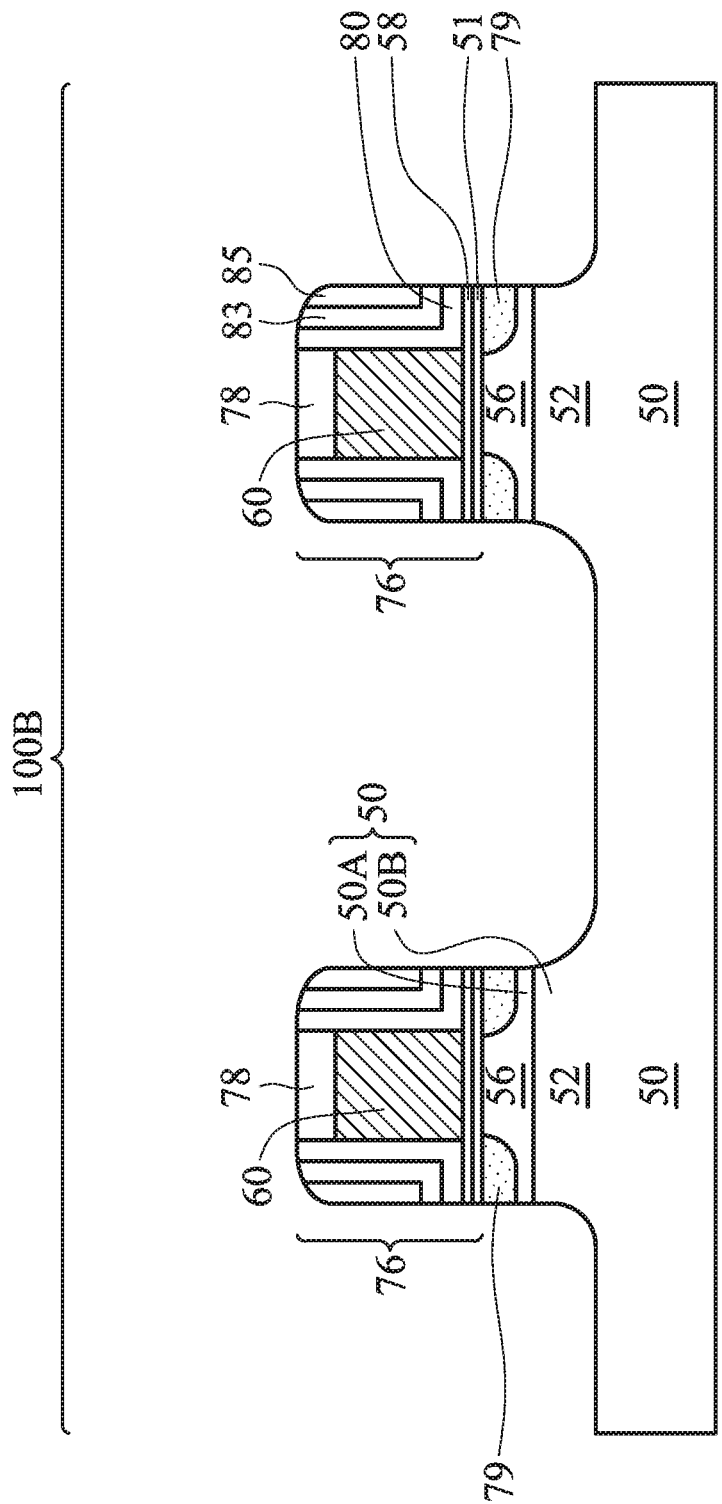

Referring first to FIGS. 18A-C, source/drain regions of the epitaxial fins in the second region 100B are etched to form recesses. The etching may be performed in a manner that a recess is formed between neighboring dummy gates 76, as shown in FIG. 16B. Any acceptable etching process may be used.

Figure 19A:
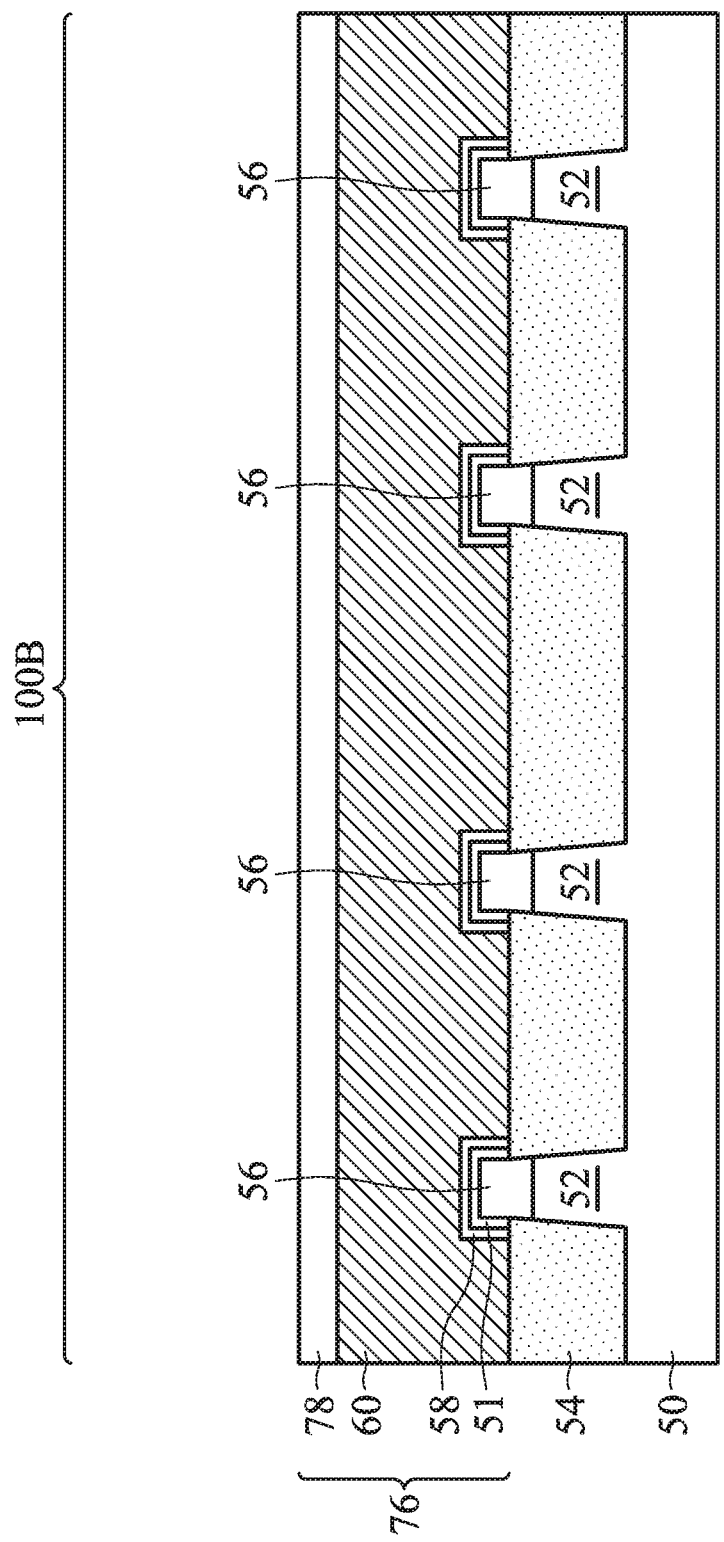
FIGS. 19A, 19B, and 19C are cross-sectional views of intermediate stages in the manufacture of a finFET device in accordance with some embodiments.
Figure 19B:
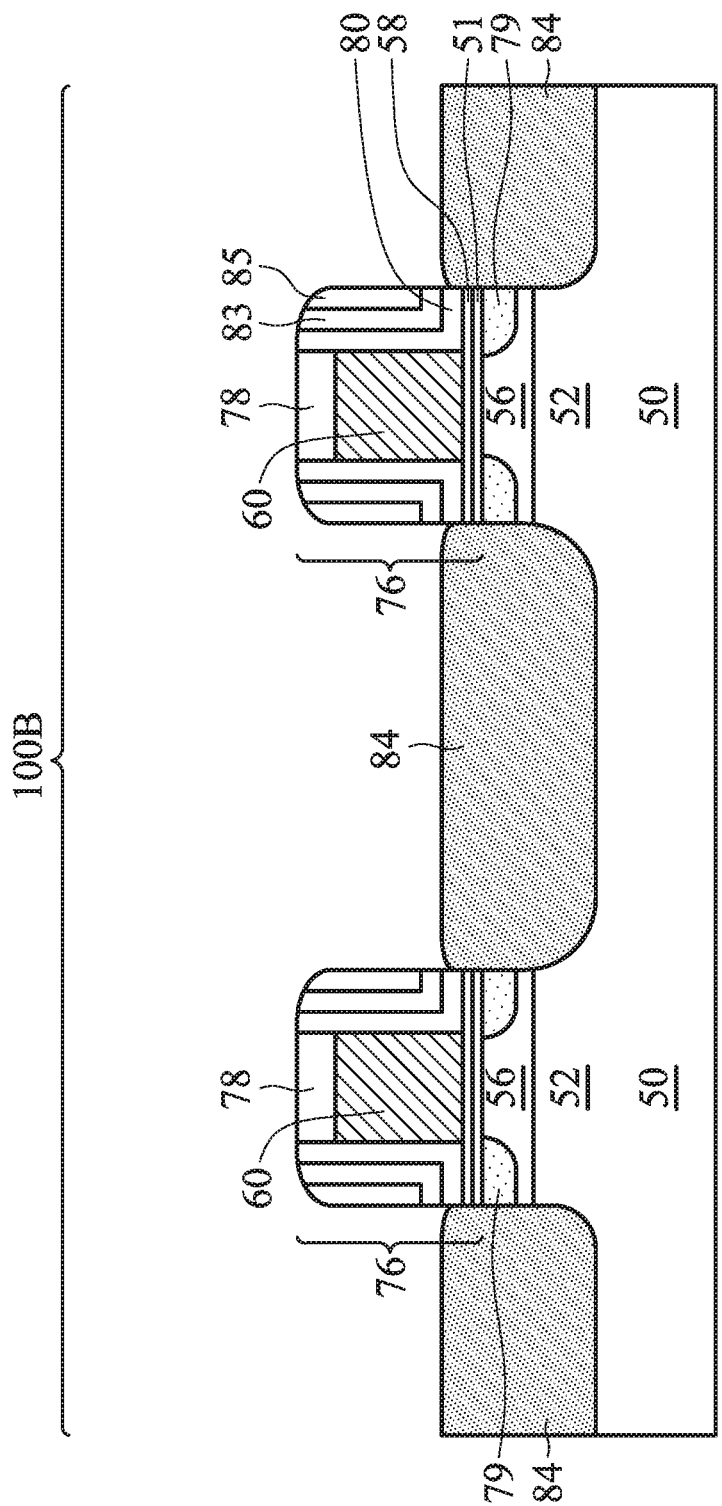
Figure 19C:
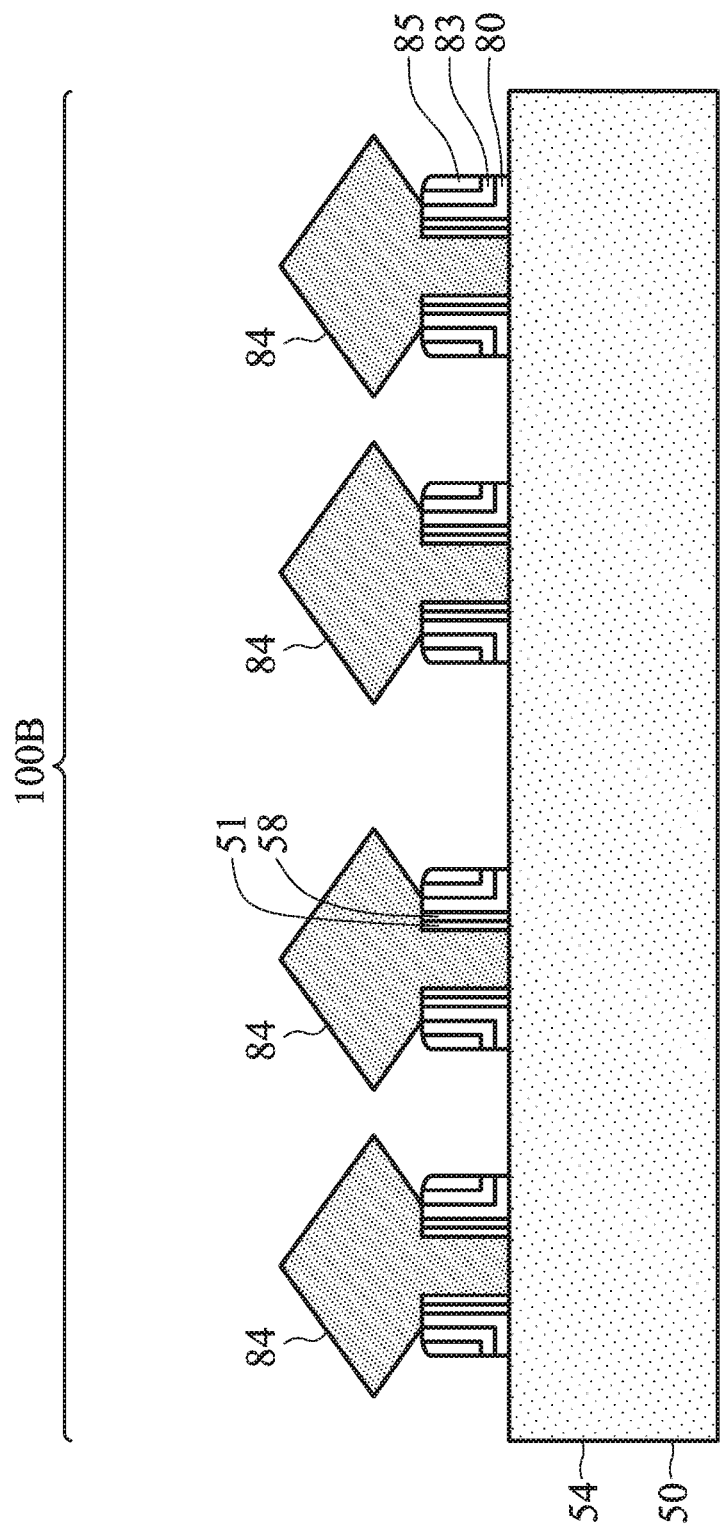
Figure 20:
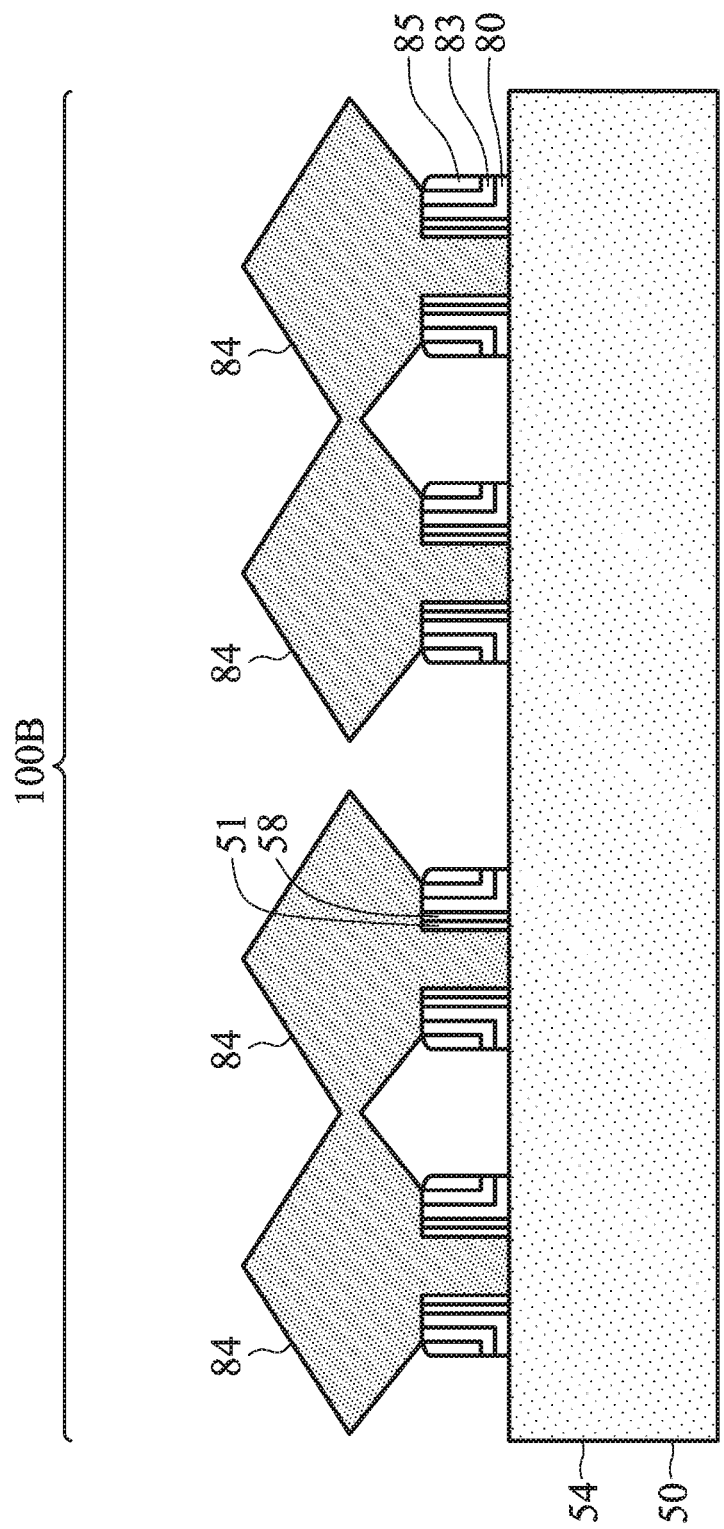
FIG. 20 is a cross-sectional view of an intermediate stage in the manufacture of a finFET device in accordance with some embodiments.

Next, epitaxial source/drain regions 84 in the second region 100B are epitaxially grown in the recesses, as shown in FIGS. 19A-C. The epitaxial source/drain regions 84 may include any acceptable material, such as material that is appropriate for p-type FinFETs. For example, if the fin 56 comprises silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. In the second region 100B, epitaxial source/drain regions 84 are formed in the fins 56 such that each dummy gate 70 is disposed between respective neighboring pairs of the epitaxial source/drain regions 84. In some embodiments epitaxial source/drain regions 84 may extend may extend past fins 56 and into the semiconductor strips 52.

The epitaxial source/drain regions 84 in the second region 100B may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The p-type impurities for source/drain regions in the second region 50C, e.g., the PMOS region, may be any of the p-type impurities previously discussed. In other embodiments, the epitaxial source/drain regions 84 may be in situ doped during growth.

FIGS. 19A-C depicts embodiments of epitaxial source/drain regions 84 in which each source/drain region 84 is physically separate from other source/drain regions 84. In some embodiments, two or more adjacent source/drain regions 84 may be merged. An embodiment of a finFET having merged source/drain regions 84 is depicted in FIG. 20, which is taken along the C-C cross-section of FIG. 1. In FIG. 20, two adjacent source/drain regions 84 are merged. In some embodiments, more than two adjacent source/drain regions 84 may be merged.

Figure 21A:
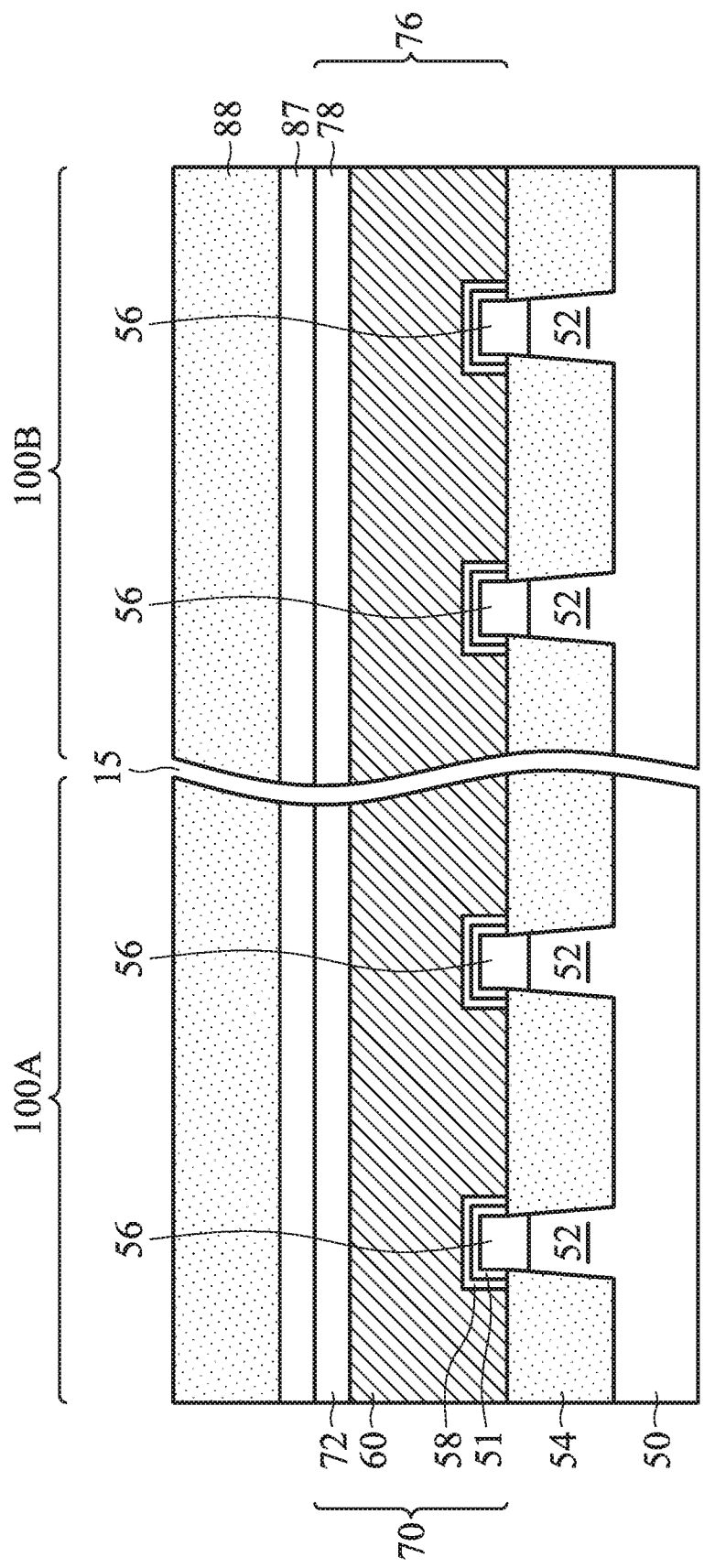
FIGS. 21A and 21B are cross-sectional views of intermediate stages in the manufacture of a finFET device in accordance with some embodiments.
Figure 21B:
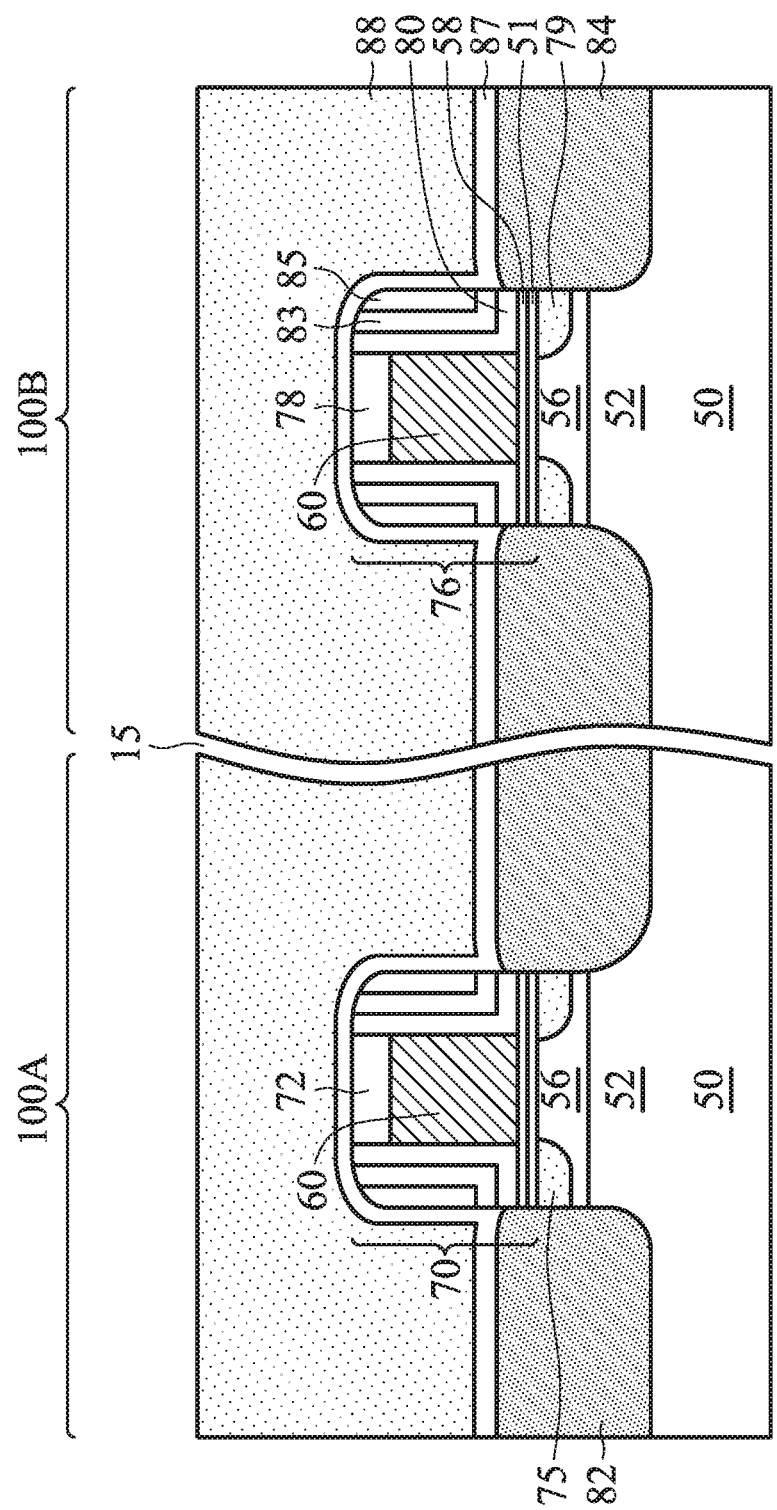

In FIGS. 21A-B, an etch stop layer 87 and an intermediate layer dielectric (ILD) 88 are deposited over the structure illustrated in FIGS. 15A-C through 20. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 22A:
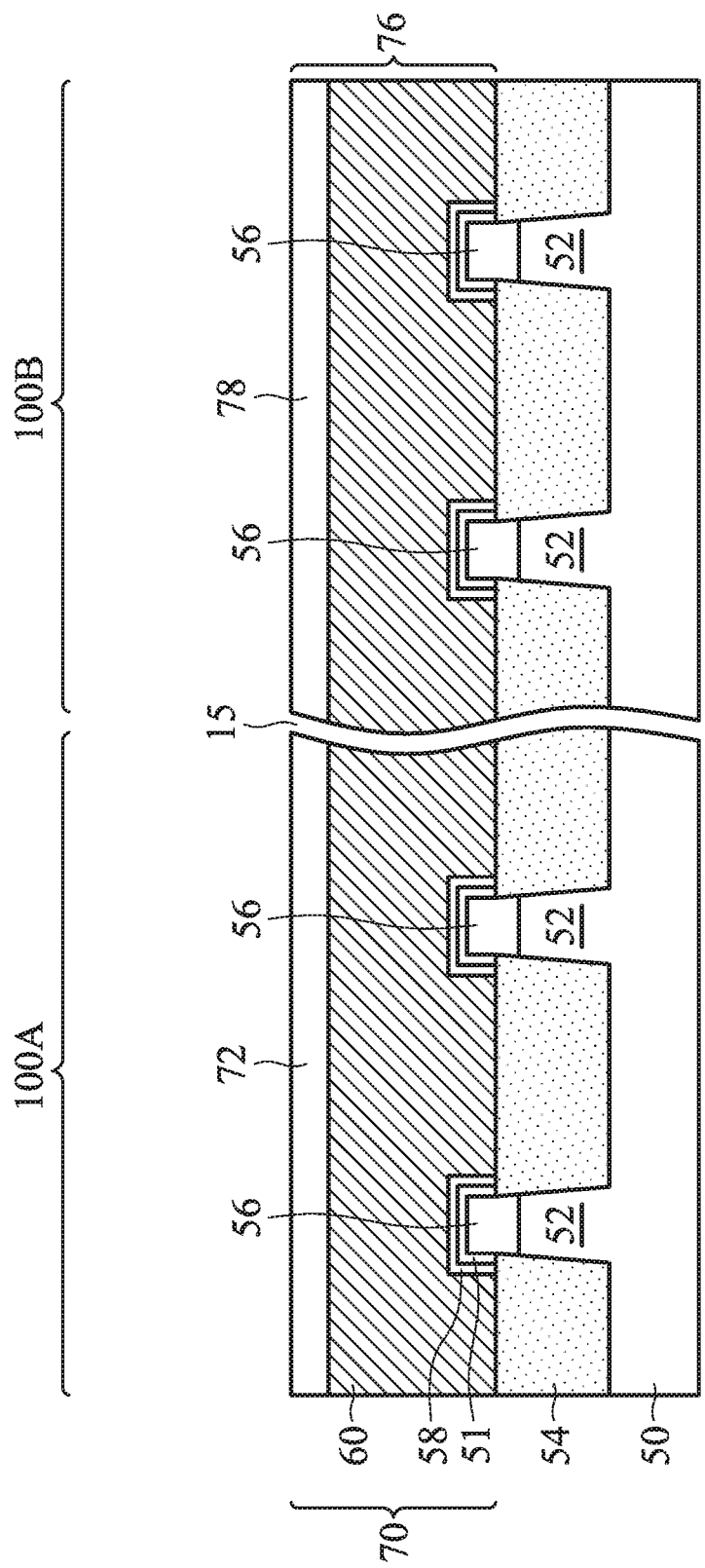
FIGS. 22A and 22B are cross-sectional views of intermediate stages in the manufacture of a finFET device in accordance with some embodiments.
Figure 22B:
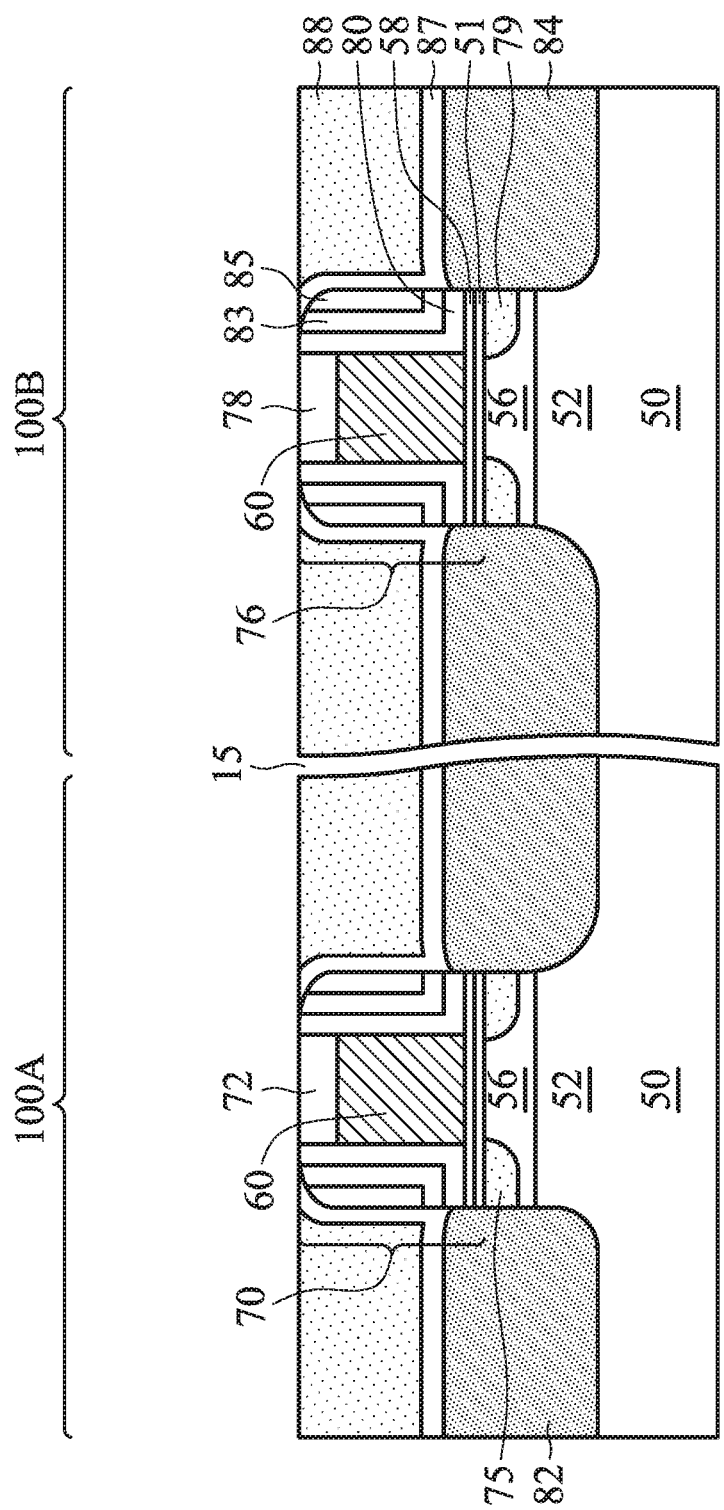

In FIGS. 22A-B, a planarization process, such as a CMP, may be performed to level the top surface of ILD 88 with the top surfaces of the dummy gates 70 and 76. After the planarization process, top surfaces of the dummy gates 70 and 76 are exposed through the ILD 88. In some embodiments, the CMP may remove the masks 72 and 78, or portions thereof. In other embodiments, masks 72 and 78 may be removed before ILD 88 is deposited.

Figure 23A:
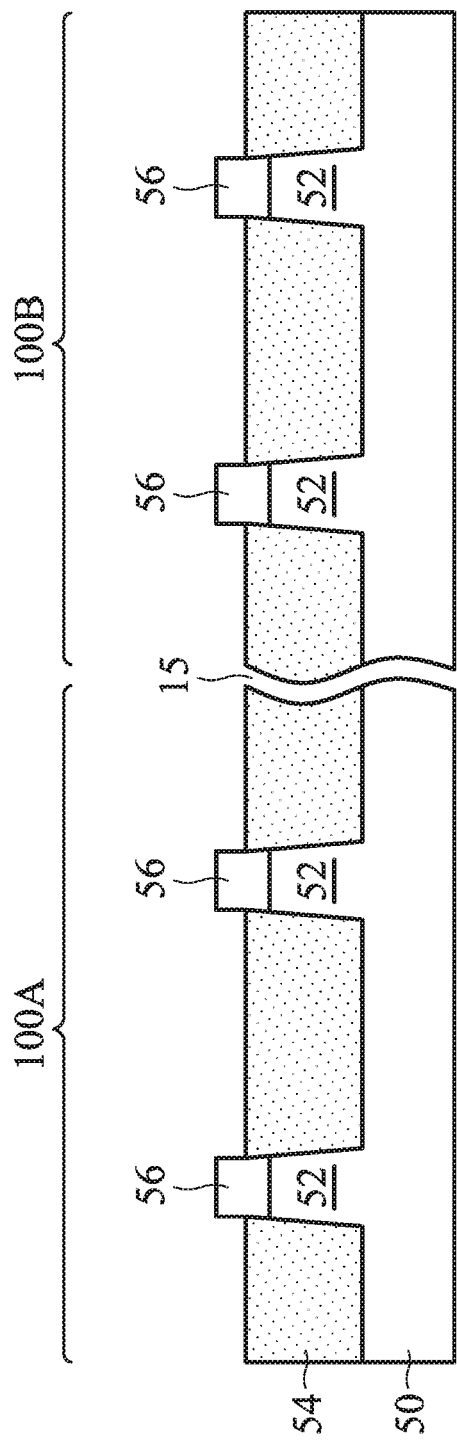
FIGS. 23A and 23B are cross-sectional views of intermediate stages in the manufacture of a finFET device in accordance with some embodiments.
Figure 23B:
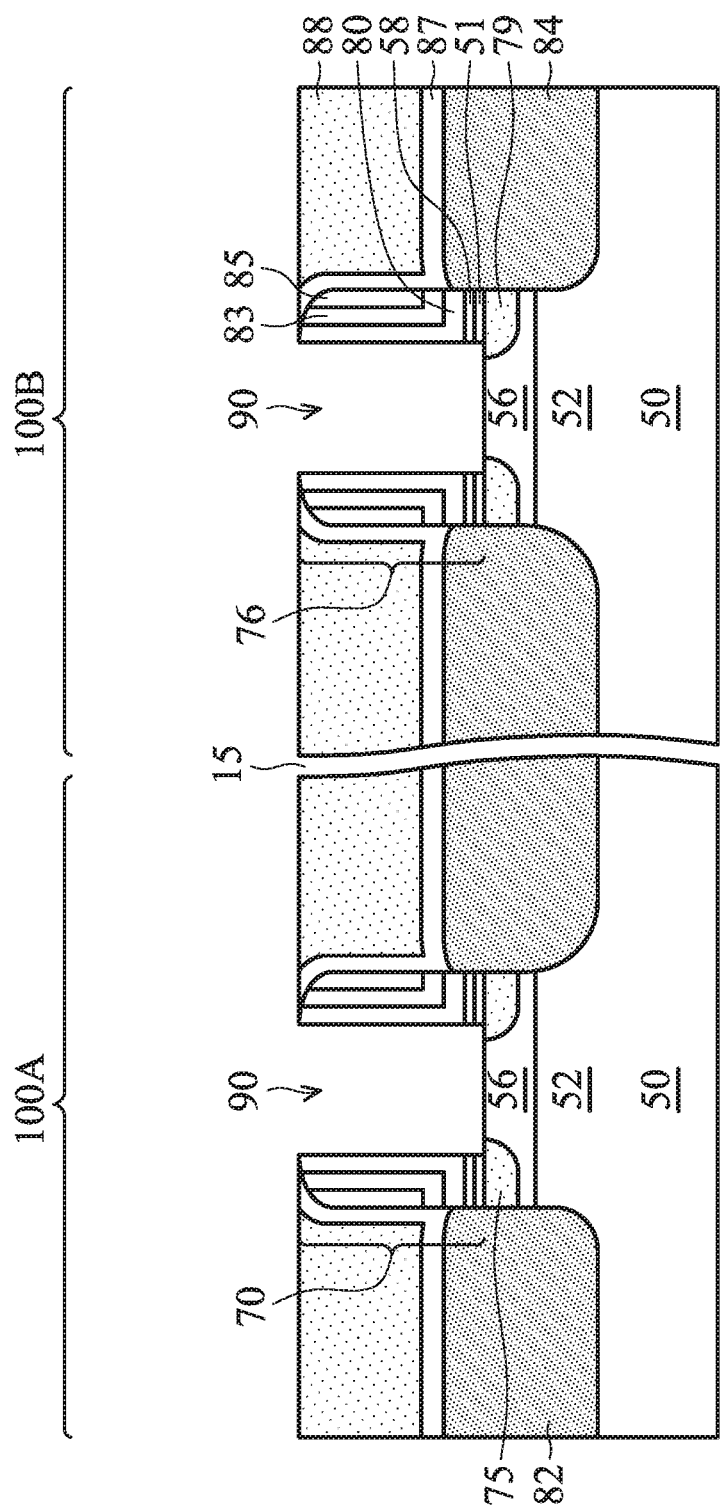

In FIGS. 23A-B, remaining portions of masks 72 and 78 and the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. In embodiments in which dummy dielectric layer 58 is optionally not included, capping layer 51 may be used as an etch stop layer when the dummy gates 70 and 76 are etched. The dummy dielectric layer 58 and the capping layer 51, or just the capping layer 51 if dummy dielectric layer 58 is not included, may then be removed after the removal of the dummy gates 70 and 76. The resulting structure is shown in FIGS. 23A-B.

As discussed earlier, the capping layer 51 may prevent or reduce the diffusion of germanium or other ions from fins 56 into the dummy dielectric layer and the dummy gate, and therefore may prevent or reduce a buildup of a high concentration of germanium at the interface of the dummy dielectric layer 58 and the dummy gates 70 and 76. As such, after the removal of dummy gates 70 and 76 using the etching process, the residue that would have been created by the buildup of a high concentration of germanium at the interface of the dummy dielectric layer 58 and the dummy gates 70 and 76 may be reduced or prevented.

Figure 24A:
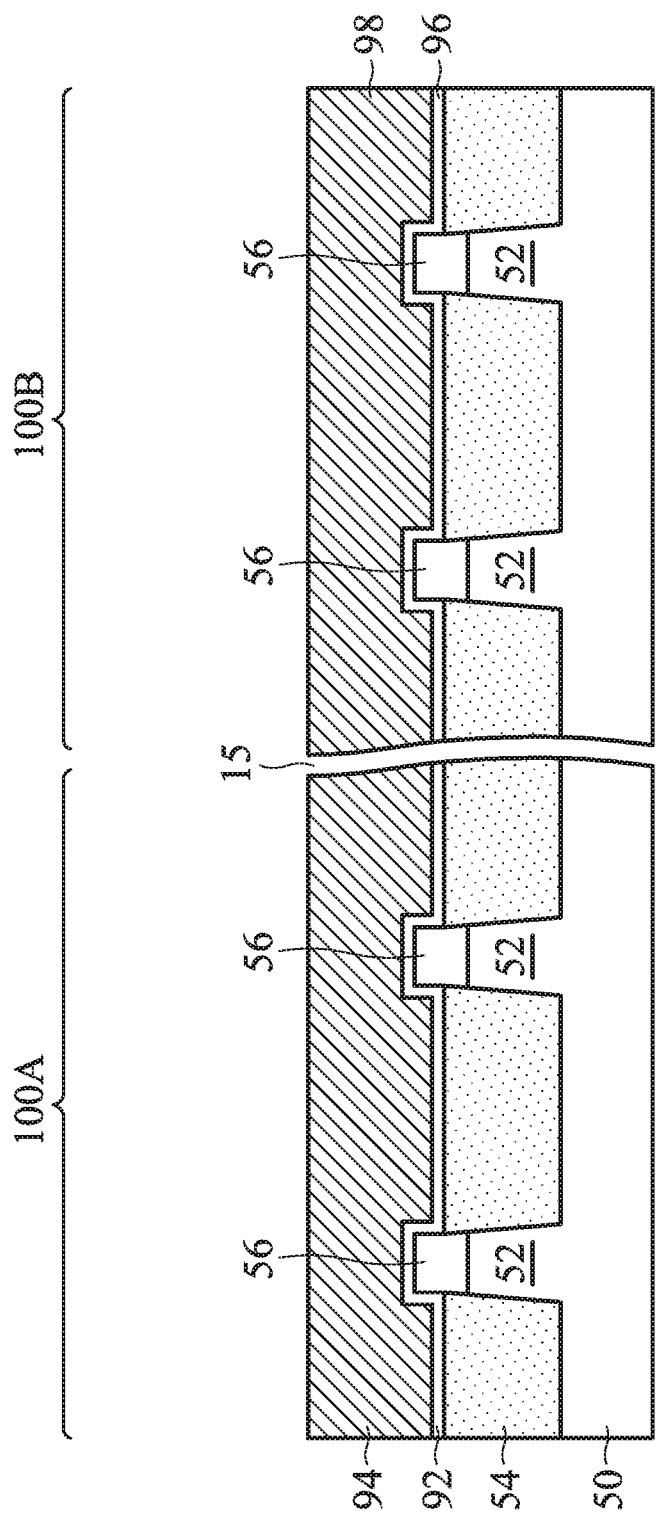
FIGS. 24A and 24B are cross-sectional views of intermediate stages in the manufacture of a finFET device in accordance with some embodiments.
Figure 24B:
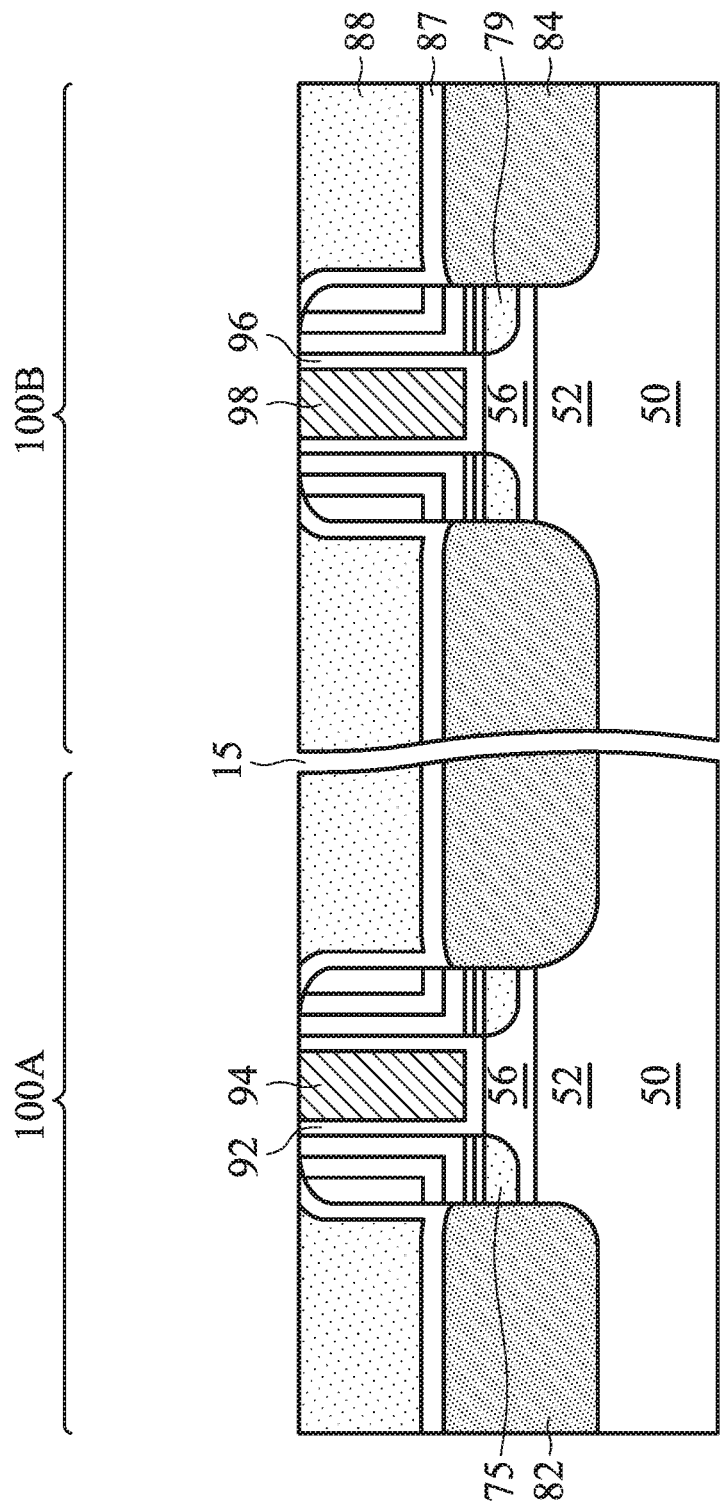

In FIGS. 24A-B, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88 (not explicitly shown in FIGS. 24A-B). In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Tl, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. After the filling of gate electrodes 94 and 98, in step 228, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting FinFETs.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 26:
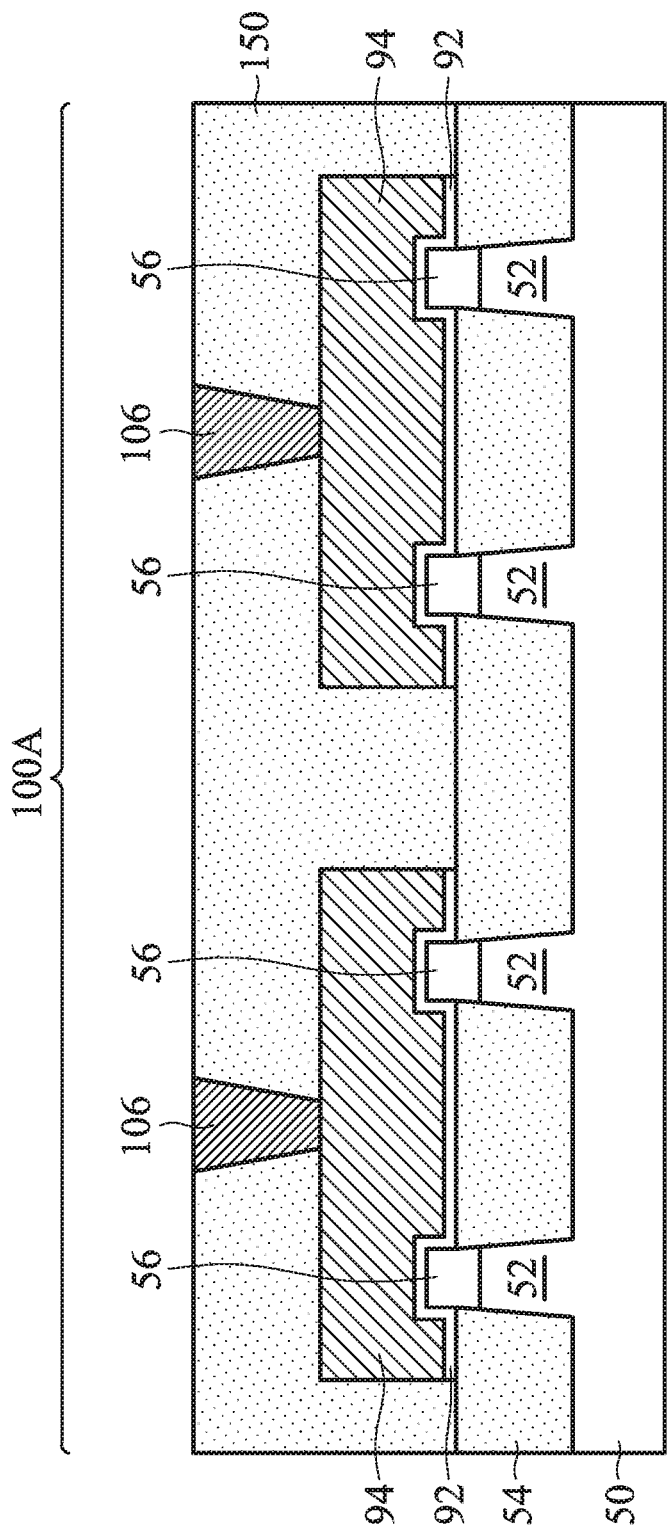
FIGS. 26 and 27 are cross-sectional views of intermediate stages in the manufacture of a finFET device in accordance with some embodiments.
Figure 27:
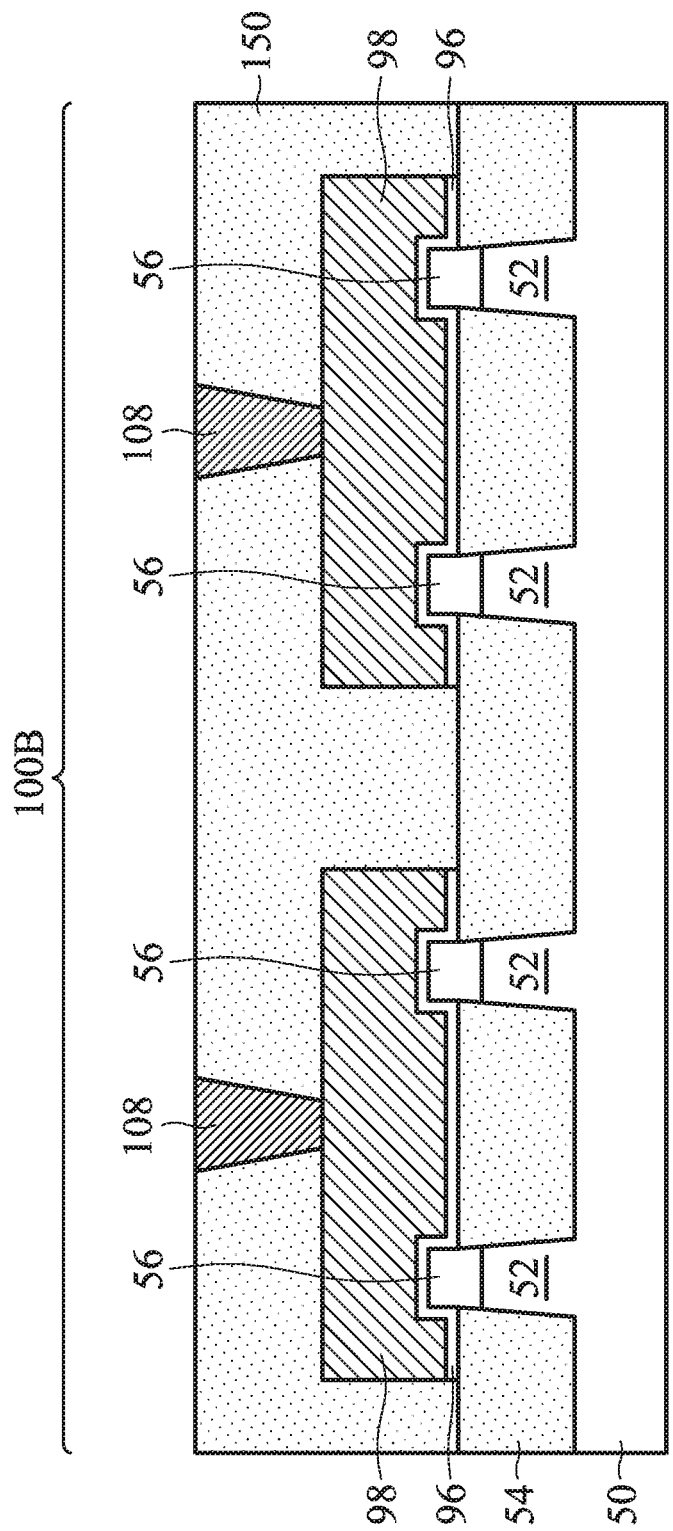

Furthermore, gate electrode 94 and gate dielectric layer 92 may be physically separated from gate stacks of adjacent finFET devices in region 100A (see e.g., FIG. 26). Similarly, gate electrode 98 and gate dielectric layer 96 may be physically separated from gate stacks of adjacent finFET devices in region 100B (see e.g., FIG. 27). In some embodiments, gate electrodes 94/98 and gate dielectric layers 92/96 may be formed to have a same pattern as dummy gate stacks 70/76 (see FIG. 7A). In such embodiments, gate electrodes 94/98 and gate dielectric layers 92/96 may be physically separated from adjacent gate stacks because dummy gate stacks 70/76 were previously patterned to be physically separated from adjacent dummy gate stacks as discussed above with respect to FIG. 10A. In other embodiments, a combination of photolithography and etching may be employed to pattern gate electrodes 94/98 and gate dielectric layers 92/96 after deposition.

Figure 25A:
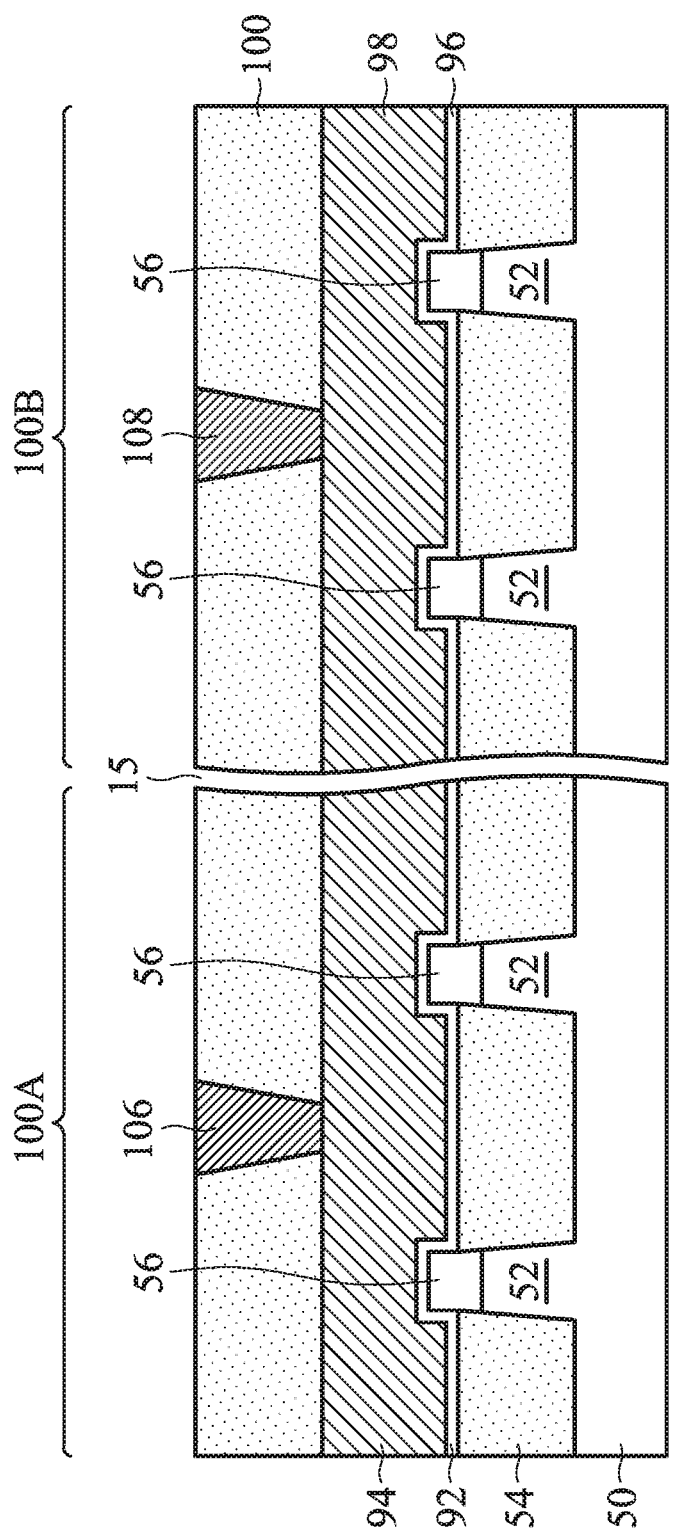
FIGS. 25A and 25B are cross-sectional views of intermediate stages in the manufacture of a finFET device in accordance with some embodiments.
Figure 25B:
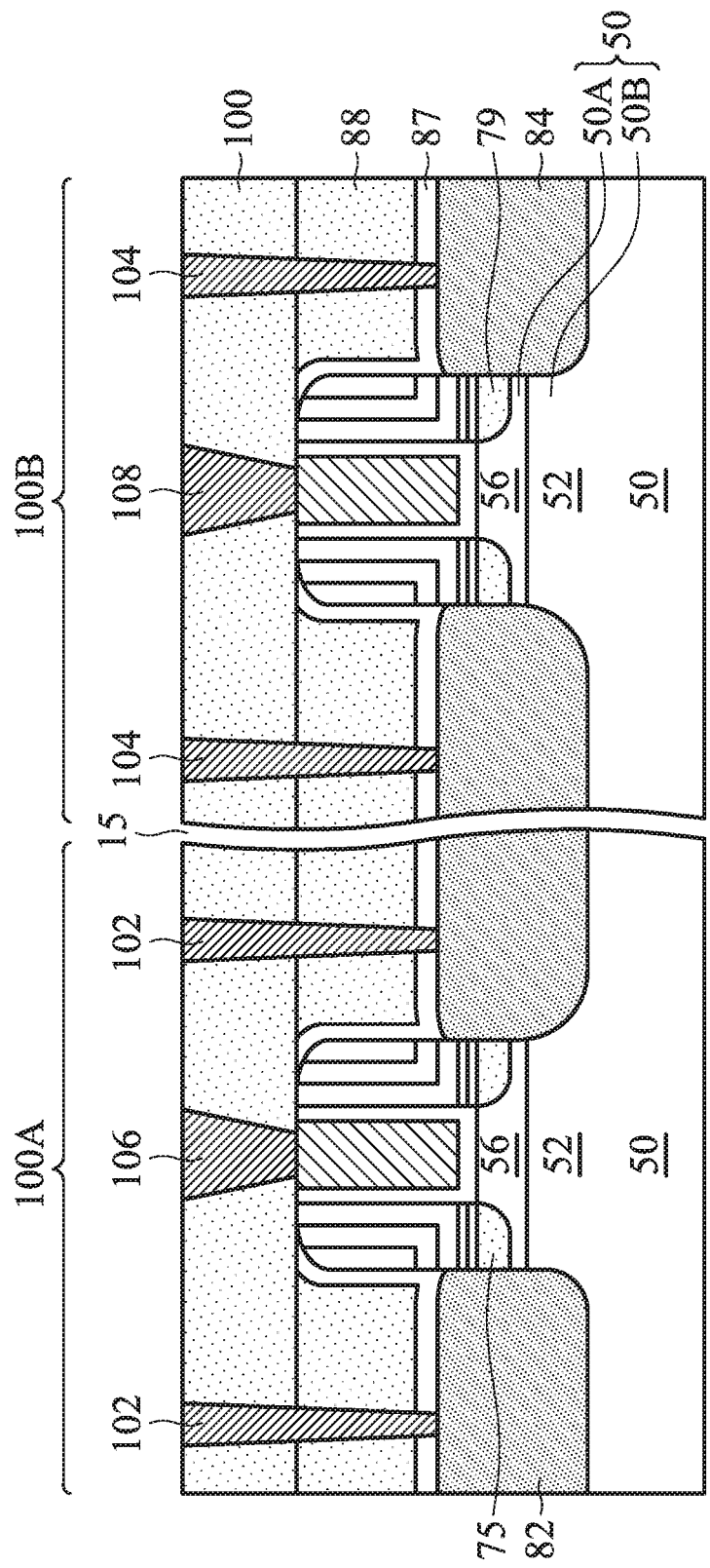

In FIGS. 25A-B, an ILD 100 is deposited over ILD 88. Further illustrated in FIGS. 23A-C, contacts 102 and 104 are formed through ILD 100 and ILD 88 and contacts 106 and 108 are formed through ILD 100. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. Openings for contacts 102 and 104 are formed through the ILDs 88 and 100. Openings for contacts 106 and 108 are formed through the ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form contacts 102 and 104 in the openings. An anneal process may be performed to form a silicide at the interface between the epitaxial source/drain regions 82 and 84 and the contacts 102 and 104, respectively. Contacts 102 are physically and electrically coupled to the epitaxial source/drain regions 82, contacts 104 are physically and electrically coupled to the epitaxial source/drain regions 84, contact 106 is physically and electrically coupled to the gate electrode 94, and contact 108 is physically and electrically coupled to the gate electrode 98.

While contacts 102 and 104 are depicted in FIG. 23B in a same cross-section as contacts 106 and 108, this depiction is for purposes of illustration and in some embodiments contacts 102, 104 are disposed in different cross-sections from contacts 106 and 108.

As discussed herein, when fins of a finFET device comprise certain ions, e.g. germanium, the ions may diffuse from the fins into a dummy dielectric and a dummy gate that are subsequently formed over the fins. In subsequent processing a dummy dielectric and a dummy gate may be formed over fins 56 (see FIGS. 7A-B and 10A-C). For example, if fins 56 comprise germanium, then the germanium in the fins 56 may diffuse from fins 56 into the dummy gate dielectric and the dummy gate. In some embodiments, germanium may diffuse until there is a high concentration of germanium at an interface of the dummy dielectric and the dummy gate. The high concentration of germanium at the interface of the dummy dielectric and the dummy gate may cause a degradation in the material of the dummy gate dielectric along the interface. During a subsequent removal of the dummy gate and the dummy dielectric to form a replacement gate and replacement gate dielectric, the degradation in the quality of the material of the dummy gate dielectric may create undesirable residue in the opening created by the removal of the dummy gate and the dummy dielectric.

A method is provided in accordance with some embodiments. The method includes forming a capping layer over a fin of a fin field effect transistor (finFET), where the fin is formed of a material comprising germanium. The method also includes forming a dummy dielectric layer over the capping layer. The method also includes forming a dummy gate over the dummy dielectric layer. The method also includes removing the dummy gate, where after the removing of the dummy gate the fin is exposed through an opening in the dummy dielectric layer and the capping layer. The method also includes forming a replacement gate, the replacement gate contacting the fin through the opening in the dummy dielectric layer and the capping layer.

A method is provided in accordance with some embodiments. The method includes epitaxially growing a layer over a substrate, the layer being formed of a material comprising silicon and germanium. The method also includes patterning the layer and the substrate to form a fin of a fin field effect transistor (finFET), the layer being disposed in a channel region of the fin. The method also includes forming a capping layer over the fin, where the capping layer comprises $Si_3N_4$ or $Al_2O_3$. The method also includes forming a dummy gate over and contacting the capping layer. The method also includes removing the dummy gate using the capping layer as an etch stop layer.

A structure is provided in accordance with some embodiments. The structure includes a fin formed in a substrate, where the fin comprises a channel region comprising germanium. The structure also includes a gate stack over the fin, wherein the gate stack contacts the fin through an opening in a capping layer over the fin and an opening in a dummy dielectric layer over the capping layer, where the dummy dielectric layer is made of a different material than the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a fin formed in a substrate, wherein the fin comprises a channel region, the channel region comprising germanium;
    a gate stack over the fin, wherein the gate stack contacts the fin through a capping layer over the fin and a dummy dielectric layer over the capping layer, wherein the capping layer is interposed between the gate stack and the channel region, wherein the dummy dielectric layer is made of a different material than the capping layer; and
    an electrical contact over the gate stack.

2. The structure according to claim 1, wherein the capping layer comprises substantially pure silicon, SiON, $Al_2O_3$, or $Si_3N_4$.

3. The structure according to claim 2, wherein the capping layer comprises substantially pure silicon, the electrical contact is configured to apply a voltage of 1.5V to the gate stack, and wherein a combined thickness of the capping layer and the dummy dielectric layer is about 25 Å to about 45 Å.

4. The structure according to claim 2, wherein the capping layer comprises substantially pure silicon, the electrical contact is configured to apply a voltage of 1.8V to the gate stack, and wherein a combined thickness of the capping layer and the dummy dielectric layer is about 30 Å to about 50 Å.

5. The structure according to claim 2, wherein the capping layer comprises SiON, the electrical contact is configured to apply a voltage of 1.5V to the gate stack, and wherein a combined thickness of the capping layer and the dummy dielectric layer is about 25 Å to about 45 Å.

6. The structure according to claim 2, wherein the capping layer comprises SiON, the electrical contact is configured to apply a voltage of 1.8V to the gate stack, and wherein a combined thickness of the capping layer and the dummy dielectric layer is about 30 Å to about 50 Å.

7. The structure according to claim 2, wherein the capping layer comprises $Al_2O_3$, the electrical contact is configured to apply a voltage of 1.5V to the gate stack, and wherein a combined thickness of the capping layer and the dummy dielectric layer is about 25 Å to about 45 Å.

8. The structure according to claim 2, wherein the capping layer comprises $Al_2O_3$, the electrical contact is configured to apply a voltage of 1.8V to the gate stack, and wherein a combined thickness of the capping layer and the dummy dielectric layer is about 30 Å to about 50 Å.

9. The structure according to claim 2, wherein the capping layer comprises $Si_3N_4$, the electrical contact is configured to apply a voltage of 1.5V to the gate stack, and wherein a combined thickness of the capping layer and the dummy dielectric layer is about 25 Å to about 45 Å.

10. The structure according to claim 2, wherein the capping layer comprises $Si_3N_4$, the electrical contact is configured to apply a voltage of 1.8V to the gate stack, and wherein a combined thickness of the capping layer and the dummy dielectric layer is about 30 Å to about 50 Å.

11. A device, comprising:
    a substrate;
    a fin formed in the substrate, the fin comprising an epitaxy region, wherein the epitaxy region comprises germanium;
    a capping layer overlying the epitaxy region of the fin, wherein the capping layer comprises substantially pure silicon, SiON, $Al_2O_3$, or $Si_3N_4$;
    a dummy dielectric overlying the capping layer, wherein a material composition of the dummy dielectric is different than a material composition of the capping layer;
    a gate dielectric layer extending through the capping layer and the dummy dielectric to contact the epitaxy region of the fin, wherein a bottom surface of the gate dielectric layer is level with a bottom surface of the capping layer;
    a gate electrode overlying the gate dielectric layer;
    a gate spacer adjacent the gate dielectric layer, the dummy dielectric and the capping layer being interposed between the epitaxy region of the fin and the gate spacer; and
    an electrical connector contacting the gate electrode.

12. The device according to claim 11, wherein the capping layer comprises substantially pure silicon, a concentration of germanium of the epitaxy region is 25% or more, and a thickness of the capping layer is in a range of about 10 Å to about 20 Å.

13. The device according to claim 11, wherein the capping layer comprises SiON, a concentration of germanium of the epitaxy region is 25% or more, and a thickness of the capping layer is in a range of about 5 Å to about 15 Å.

14. The device according to claim 13, wherein a surface nitrogen concentration of the capping layer has an atomic percentage in a range of about 2% to about 30%.

15. The device according to claim 11, wherein the capping layer comprises $Al_2O_3$, the electrical connector is configured to apply a voltage of about 1.5V to the gate electrode, and a thickness of the capping layer is in a range of about 3 Å to about 42 Å.

16. The device according to claim 11, wherein the capping layer comprises $Si_3N_4$, the electrical connector is configured to apply a voltage of about 1.8V to the gate electrode, a concentration of germanium of the epitaxy region is 25% or more, and a thickness of the capping layer is in a range of about 20 Å to about 50 Å.

17. The device according to claim 11, wherein the capping layer comprises $Si_3N_4$, the electrical connector is configured to apply a voltage of about 1.5V to the gate electrode, and a thickness of the capping layer is in a range of about 20 Å to about 45 Å.

18. A fin field effect transistor (finFET), comprising:
a fin comprising an epitaxy region, wherein the epitaxy region comprises a channel region, and wherein the channel region is made of silicon germanium;
a capping layer over the channel region of the fin;
a dummy dielectric layer over the capping layer; and
a gate stack over the fin, wherein the gate stack contacts the fin through the capping layer and through the dummy dielectric layer, wherein the capping layer is interposed between the gate stack and the channel region such that the capping layer reduces diffusion of germanium ions from the channel region, and wherein the dummy dielectric layer is made of a different material than the capping layer.

19. The finFET according to claim 18, wherein a germanium concentration of the silicon germanium is at least 25%.

20. The finFET according to claim 18, wherein the capping layer comprises substantially pure silicon, SiON, $Al_2O_3$, or $Si_3N_4$.

* * * * *